United States Patent
Banks et al.

[11] Patent Number: 6,015,722
[45] Date of Patent: Jan. 18, 2000

[54] METHOD FOR ASSEMBLING AN INTEGRATED CIRCUIT CHIP PACKAGE HAVING AN UNDERFILL MATERIAL BETWEEN A CHIP AND A SUBSTRATE

[75] Inventors: Donald R. Banks; Ronald G. Pofahl; Mark F. Sylvester, all of Eau Claire; William G. Petefish, Chippewa Falls; Paul J. Fischer, Eau Claire, all of Wis.

[73] Assignee: Gore Enterprise Holdings, Inc., Newark, Del.

[21] Appl. No.: 09/369,800

[22] Filed: Aug. 6, 1999

Related U.S. Application Data

[63] Continuation of application No. 09/252,722, Feb. 19, 1999, Pat. No. 5,970,319, which is a continuation of application No. 09/166,056, Oct. 2, 1998, Pat. No. 5,919,329.

[60] Provisional application No. 60/061,821, Oct. 14, 1997.

[51] Int. Cl.[7] .............................. H01L 21/58; H01L 21/60
[52] U.S. Cl. ...................... 438/108; 438/118; 438/125; 438/612

[58] Field of Search .................................. 438/108, 115, 438/118, 125, 612, FOR 370, FOR 375

[56] References Cited

U.S. PATENT DOCUMENTS

| | | | |
|---|---|---|---|
| 3,953,566 | 4/1976 | Gore | 264/288 |
| 4,482,516 | 11/1984 | Bowman et al. | 264/127 |
| 4,705,762 | 11/1987 | Ota et al. | 501/87 |
| 4,985,296 | 1/1991 | Mortimer, Jr. | 428/220 |
| 5,545,473 | 8/1996 | Ameen et al. | 428/283 |
| 5,831,833 | 11/1998 | Shirakawa et al. . | |
| 5,926,696 | 7/1990 | Baxter et al. . | |

*Primary Examiner*—David E. Graybill
*Attorney, Agent, or Firm*—Victor M. Genco, Jr.

[57] ABSTRACT

The present invention generally relates to the field of integrated circuit chip packaging. More particularly, the present invention relates to methods of manufacturing integrated circuit chip packages, and methods for electrically connecting and bonding or attaching semiconductor devices to an integrated circuit chip.

2 Claims, 17 Drawing Sheets

METHOD FOR ASSEMBLING AN INTEGRATED CIRCUIT CHIP PACKAGE HAVING AN UNDERFILL MATERIAL BETWEEN A CHIP AND A SUBSTRATE

RELATED APPLICATIONS

The present application is a continuation of U.S. patent application Ser. No. 09/252,722 filed Feb. 19, 1999, U.S. Pat. No. 5,970,319 which is a continuation of Ser. No. 09/166,056 filed Oct. 2, 1998 now U.S. Pat. No. 5,919,329, issued on Jul. 6, 1999, which is based on co-pending United States Provisional Patent Application 60/061,821 filed Oct. 14, 1997.

FIELD OF THE INVENTION

The present invention generally relates to the field of integrated circuit chip packaging. More particularly, the present invention relates to methods of manufacturing integrated circuit chip packages, and methods for electrically connecting and bonding or attaching semiconductor devices to an integrated circuit chip.

BACKGROUND OF THE INVENTION

Interconnection and packaging related issues are among the main factors that determine not only the number of circuits that can be integrated on an electronic computer chip ("chip"), but also the performance of the chip. These issues have gained in importance as advances in integrated circuit chip design have led to reduced feature sizes of transistors and enlarged chip dimensions. Industry has come to realize that merely having a fast chip will not result in a fast system; it must also be supported by an equally fast and reliable package.

Essentially, a package, or packaging, supplies the chip with signals and power, and performs other functions such as heat removal, physical support and protection from the environment. Another important function is simply to redistribute the tightly packed I/Os off the chip to the I/Os of a printed wiring board.

An example of a package-chip system is the "flip-chip" integrated circuit mounted on an area array organic package. Flip-chip mounting entails placing solder bumps on a die or chip, flipping the chip over, aligning the chip with the contact pads on a substrate, and re-flowing the solder balls in a furnace to establish bonding between the chip and the substrate. This method is advantageous in certain applications because the contact pads are distributed over the entire chip surface rather than being confined to the periphery as in wire bonding and most tape-automated bonding (TAB) techniques. As a result, the maximum number of I/O and power/ground terminals available can be increased, and signal and power/ground interconnections can be more efficiently routed on the chips.

With flip-chip packaging, thermal expansions due to material property mismatches between a semiconductor chip and a substrate of an organic chip package can cause strains at the solder bumps, and thus, could lead to failure of the chip/package connection. Regardless of which packaging technique is employed, material issues, such as the aforementioned thermally induced strain, cause a chip package designer to select and match chip packaging materials with great care.

The current trend in integrated circuit chip packaging technology is shifting from thick ceramic substrate-based interconnection circuit devices to relatively thinner organic substrate-based interconnection circuit devices for single chip modules (SCMs) and multi-chip modules (MCMs). However, when these relatively thinner organic substrate-based interconnection circuit devices are attached to a semiconductor chip or die using conventional bonding and assembly techniques and methods, the thinner structures of these interconnection circuit devices flex and bend more readily than the thicker ceramic substrate-based interconnection circuit devices. This occurs primarily because of the differences in the coefficients of thermal expansion (CTE) between the materials used in the organic substrate devices and the integrated circuit die or chip, and because of the mechanical stresses that occur when these interconnection devices and chips are bonded and assembled with conventional bonding and assembly techniques and methods.

A need exists for an improved method for assembling an integrated circuit chip package and an improved method for bonding a semiconductor chip on a substrate of an organic substrate-based interconnection circuit device which minimize mechanical stresses between the chip and the chip package or interconnection circuit device.

BRIEF DESCRIPTION OF THE DRAWINGS

The present invention is illustrated by way of example and not limitation in the accompanying figures in which like reference numerals indicate similar elements and in which.

DETAILED DESCRIPTION OF THE INVENTION

Figure 1:
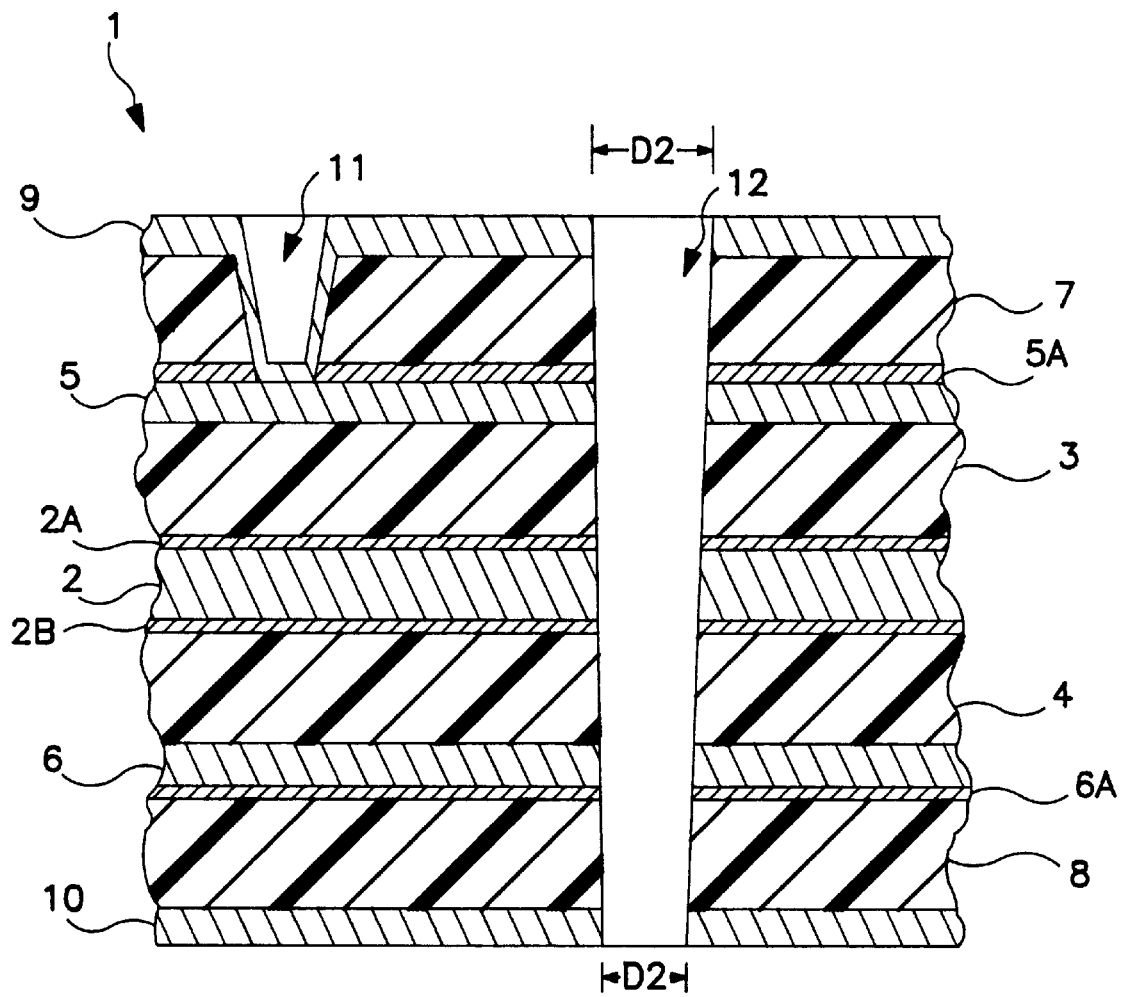
FIG. 1 is a cross-sectional view of a laminated substrate having a blind-via and a through-via.

Referring to FIG. 1, a laminated substrate 1 of an integrated circuit chip package (not shown) is constructed by serially, or sequentially, laminating alternating layers of conductive and dielectric layers together. The various layers are positioned in a stack and then pressed together, usually with a dielectric material in a b-stage of curing so that the layers are not fully cured until after pressing.

Laminated substrate 1 may include any number of layers, although FIG. 1 illustrates a seven layer structure. Dielectric layers 3 and 4 are disposed on opposite sides of the core layer 2, and conductive layers 5 and 6 are disposed on the dielectric layers 3 and 4, respectively. A dielectric layer 7 is provided on the conductive layer 5, and a dielectric layer 8 is provided on the conductive layer 6. A conductive layer 9 is provided on the dielectric layer 7 and a conductive layer 10 is provided on the dielectric layer 8.

The layers are applied serially. First, dielectric layers 3 and 4 and conductive layers 5 and 6 are pressed and bonded together to core layer 2. The conductive layers are patterned, and any necessary blind-vias to connect conductive layers 3 and 4 are formed before the remaining layers are bonded to the structure. Subsequently, the additional dielectric layers 7 and 8 and conductive layers 9 and 10 are bonded to the other layers as shown in FIG. 1.

Alternatively, several metal/dielectric/metal layers can be simultaneously pressed together, rather than being done in series. This type of assembly could obviate the need for a core layer, such as core layer 2 in FIG. 1. Whether done serially or simultaneously, larger or smaller numbers of layers can be employed. Seven and nine layer substrates have many practical applications, as does the illustrated five conductive layer substrate.

A blind-via 11 extends through dielectric layer 7 and a through-via 12 extends through the entire laminated substrate 1. The laser drilling techniques employed to form vias 11 and 12 will be described more fully below. Vias 11 and 12 have entrance diameters of between 10 $\mu$m and 75 $\mu$m, inclusive. Further, through-vias formed using the methodology of the present invention are reliably and repeatably formed to have an aspect ratio, that is, the ratio of via depth to via diameter $D_1$, of between 3:1 to 25:1, inclusive.

Core layer 2 is made of a conductive material, such as a 1 oz. copper layer having a nominal thickness of 38 $\mu$m. Other well-known conductive core materials can also be used such as aluminum. Core layer 2 provides structural support for the alternately disposed dielectric and conductive layers. Typically, core layer 2 is electrically grounded when the laminated substrate is assembled as an interconnection circuit device in an integrated circuit chip package.

The conductive and dielectric layers shown in FIG. 1 are disposed symmetrically about core layer 2. That is, each dielectric or conductive layer formed on one side of core layer 2 has a corresponding layer of the same material formed on the opposite side of core layer 2. Consequently, the following description sets forth a method for forming vias with respect to only one side of core layer 2, but a similar approach is used for forming vias on the other side of core layer 2.

Dielectric layers 3, 4, 7, and 8 are preferably made from laminates of high-temperature organic dielectric substrate materials, such as, but not limited to, polyimides and polyimide laminates, epoxy resins, organic materials, or dielectric materials comprised at least in part of polytetrafluoroethylene, with or without a filler. A more detailed description of these materials is provided hereinbelow. Conductive layers 5, 6, 9 and 10 are preferably formed from a conductive material, such as copper.

Dielectric layers 3 and 4 are laminated onto core layer 2 by placing the core between two sheets of dielectric material and pressing them together. When core layer 2 is made of copper, copper oxide layers 2a and 2b, commonly known as a brown, black or red oxide, are preferably provided on opposite surfaces of core layer 2 for promoting adhesion of dielectric layers 3 and 4 to core layer 2. Copper oxide layers 2a and 2b are formed on the core layer 2 by using standard surface treatment techniques, such as immersing the core layer in a brown oxide bath or a red oxide bath solution, commercially available from McGean Rohco, at a temperature of between 120° F. to 150° F. for between 30 seconds to 5 minutes.

Dielectric layers 3 and 4 are formed from an organic substrate material, such as a high-temperature organic dielectric substrate material, to have a thickness of between about 12 $\mu$m to 100 $\mu$m, inclusive. As a representative example, dielectric layers 3 and 4 could have a nominal thickness of about 50 $\mu$m.

Conductive layers 5 and 6 are stacked on top of dielectric layers 3 and 4 and laminated together in the first pressing operation, in which core 2, dielectric layers 3 and 4 and conductive layers 5 and 6 are pressed to form a laminated subassembly. In a second pressing operation, dielectric layers 7 and 8 and conductive layers 9 and 10 are stacked and pressed to form laminated substrate 1, shown in FIG. 1.

The conductive layers are made of a conductive material, preferably a ½ oz. copper layer having a nominal thickness of 19 $\mu$m. In the final interconnection circuit device, conductive layers 5 and 6 are typically power layers, but can also be signal layers. Design and application considerations determine the package construction.

When conductive layers 5 and 6 are made of copper, copper oxide layers 5a and 6a are formed on conductive layers 5 and 6, respectively, for promoting adhesion of dielectric layers 7 and 8 to conductive layers 5 and 6. Copper oxide layers 5a and 6a are formed on the conductive layers 5 and 6, respectively, by using known techniques, such as immersing the substrate in a brown oxide bath or a red oxide bath solution, commercially available from McGean Rohco, at a temperature of between 120° F. to 150° F. for between 30 seconds to 5 minutes.

Dielectric layers 7 and 8 are preferably formed from an organic substrate material, such as a high-temperature organic dielectric substrate material, to have a thickness of between about 12 μm to 100 μm, inclusive. As a representative example, dielectric layers 7 and 8 could have a nominal thickness of about 50 μm.

Conductive layers 9 and 10 are made of a conductive material, and are preferably a ⅛ oz. copper layers having a nominal thickness of 5 μm. Typically, conductive layers 9 and 10 are conventional signal/pad layers in the final interconnection circuit device, but can also be power/pad layers.

Laser System For Forming Vias

Figure 2:
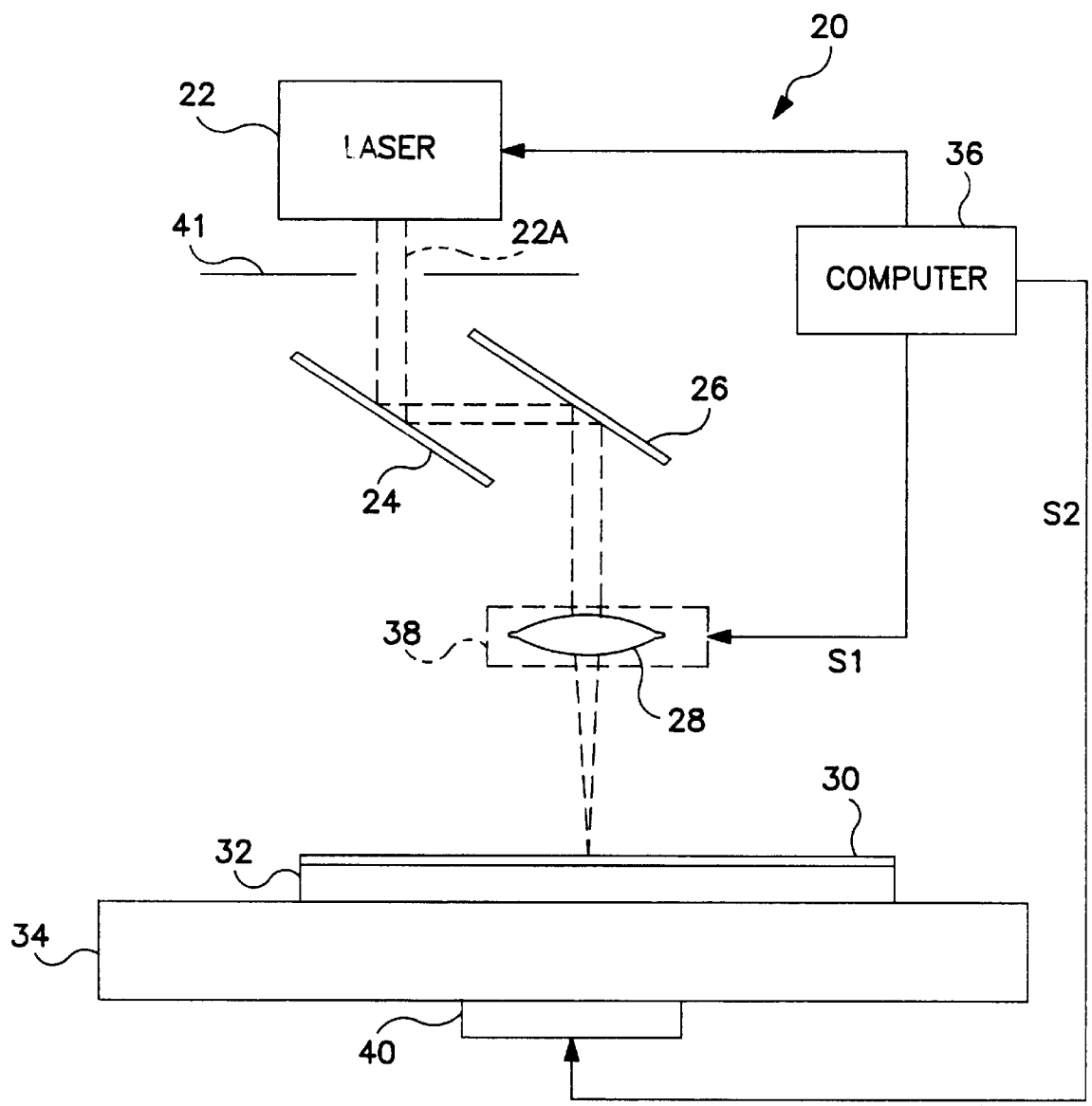
FIG. 2 is a schematic view of a laser system for forming vias.

The vias shown in FIG. 1 are formed using the laser system 20 shown in FIG. 2. Laser system 20 includes a laser source 22 which outputs a pulsed laser beam 22a that is directed through a laser optic system. The optic system includes mirrors 24 and 26, and a focusing lens 28 which directs a focused beam through a patterned mask 30, used when blind-vias are formed, onto a workpiece 32 positioned on an X-Y positioning table 34. The focused beam forms a focal spot on the substrate underlying the mask 30. The focal spot can be circular or oval in shape.

Workpiece 32 of FIG. 2 is a laminated substrate that includes a plurality of alternately disposed dielectric and conductive layers, such as the laminated substrate 1 shown in FIG. 1. After additional laminations are applied, the blind-vias or through-vias formed in one step become buried vias. Blind-vias can also be formed on the bottom-most or top-most dielectric layer, as exemplified by blind-via 11 of FIG. 1.

Laser system 20 includes a controlling device, such as computer 36, that controls the position of the focal spot of the laser beam with respect to workpiece 32. Computer 36 controls the positioning of the focal spot by issuing control signals S1 to an actuator 38 which moves lens 28 in the X direction. Computer 36 further issues control signals S2 to an actuator 40 which moves the positioning table 34 in the Y direction. The combined X and Y motion allows system 20 to move the laser beam in a manner programmed by computer 36 to form a desired type of via.

Other X-Y positioning may be employed, including galvanometers for controlling the position of mirrors 24 and 26. Galvanometers of this type are commercially available and can be installed in commercially available laser apparatuses. In any event, computer 36 can be pre-programmed for establishing the pattern of motion of the beam spot to form the desired vias. Moreover, computer 36 is operatively coupled to laser source 22 for establishing lasing parameters such as direction, speed of the beam path (in millimeters per second), pulse repetition rate, and power.

To adjust peak pulse power, computer 36 can implement a change in pulse repetition frequency, which affects peak power both by changes in average power and pulses per second, as well as the pulse duration in nanoseconds (ns). This is best done by changing pulse intervals with electronic or acousto-optic Q-switching. Power per pluse can also be changed by adjusting the current to the laser excitation source, such as in arc lamp.

The preferred pattern of movement of the laser focal spot is "trepanning" the spot, in which the beam spot starts in the center of the desired via, and gradually spirals outwardly to an outer diameter of the via. At that point the beam is caused to orbit around the via center for as many revolutions as is determined necessary for the particular via. Upon completion, the focal spot is caused to spiral back to the center and thereafter awaits the next command. An example of a trepanning velocity is 3 millimeters per second.

Choice of laser is important to the present invention. The preferred lasers are pulsed solid state lasers such as the frequency-tripled Nd:YAG (neodymium yttrium aluminum garnet) laser emitting at a 355 nm wavelength or a frequency-quadrupled Nd:YAG laser emitting at a 266 nm wavelength. Such lasers are commercially available as the Model 5000 Laser Processing System produced by Electro Scientific Industries of Portland, Oreg., USA.

Figure 3:
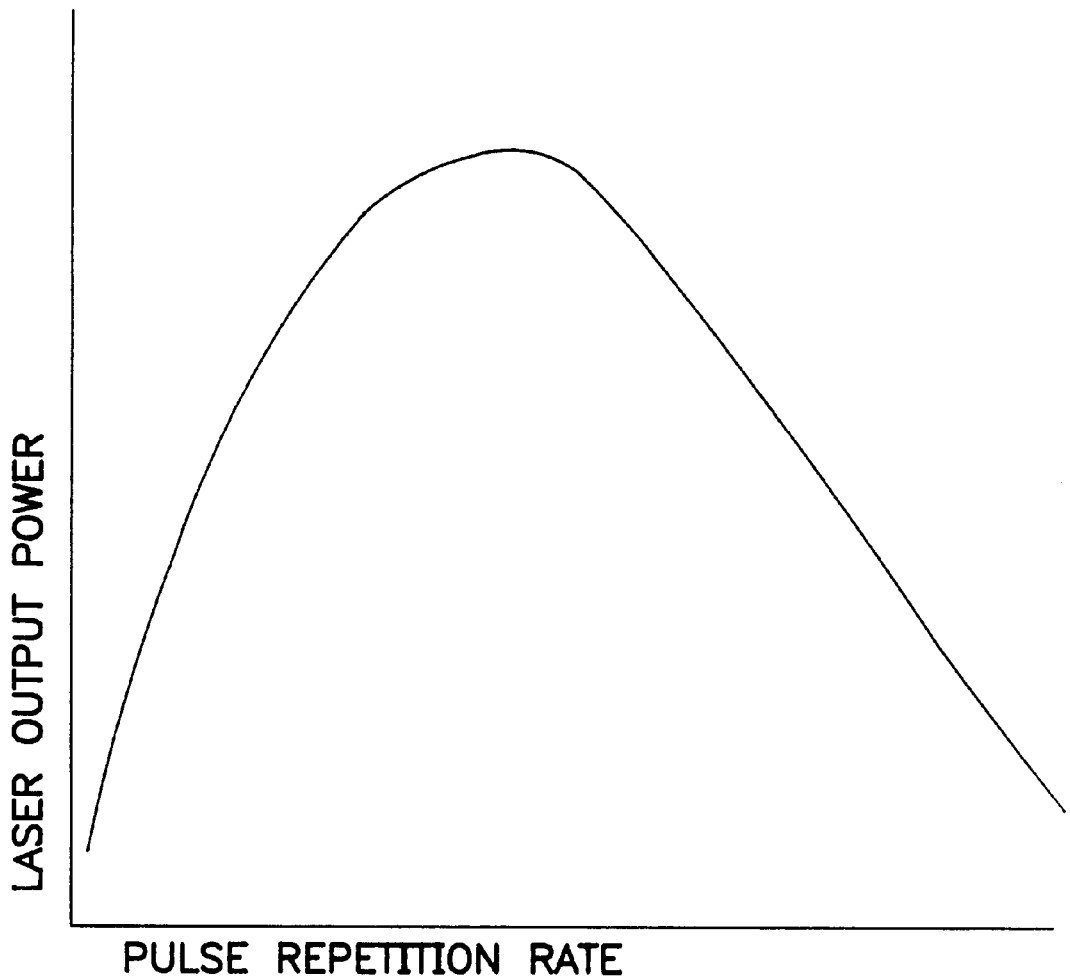
FIG. 3 is a graph showing laser output power as a function of pulse repetition rate.

FIG. 3 is a graph showing an example of laser output power as a function of pulse repetition frequency for laser source 22. As is evident therefrom, there is a non-linear relationship between average power and frequency, but up to a maximum value of average power, the pulse frequency can be increased to provide increased average power.

In changing the laser energy density in situ, the computer can control the Q-switch to vary the pulse repetition rate. Table 1 demonstrates how the laser energy and power change with repetition rate for the 355 nm Nd:YAG laser:

TABLE 1

| Rep. Rate (Hz) | Average Power (mW) | Pulse Width (nm) | Energy per Pulse (mJ) | Power per Pulse (kW) |
|---|---|---|---|---|
| 2000 | 680 | 40 | 340 | 8.5 |
| 3000 | 770 | 48 | 255 | 5.3 |
| 4000 | 770 | 55 | 195 | 3.5 |
| 5000 | 725 | 63 | 145 | 2.3 |
| 6000 | 685 | 70 | 115 | 1.6 |
| 7000 | 630 | 78 | 90 | 1.2 |
| 8000 | 580 | 85 | 75 | .9 |
| 9000 | 535 | 93 | 60 | .6 |
| 10000 | 500 | 100 | 50 | .5 |

Similarly, Table 2 demonstrates how the laser energy and power change with repetition rate for the 266 nm Nd:YAG laser:

TABLE 2

| Rep. Rate (Hz) | Average Power (mW) | Pulse Width (nm) | Energy per Pulse (mJ) | Power per Pulse (kW) |
|---|---|---|---|---|
| 2000 | 330 | 40 | 165 | 4.1 |
| 3000 | 380 | 48 | 125 | 2.6 |
| 4000 | 350 | 55 | 90 | 1.6 |
| 5000 | 290 | 63 | 60 | 1.0 |
| 6000 | 280 | 70 | 45 | 0.6 |
| 7000 | 240 | 78 | 35 | 0.4 |
| 8000 | 180 | 85 | 25 | 0.3 |
| 9000 | 140 | 93 | 15 | 0.2 |
| 10000 | 130 | 100 | 15 | 0.1 |

When the laser focal spot geometry is added to the above, energy density can be calculated. The energy density is one of the primary parameters for setting laser ablation of the substrates to form vias in the organic substrates described herein.

Method of Laser Drilling Blind-Vias

Figure 4A:
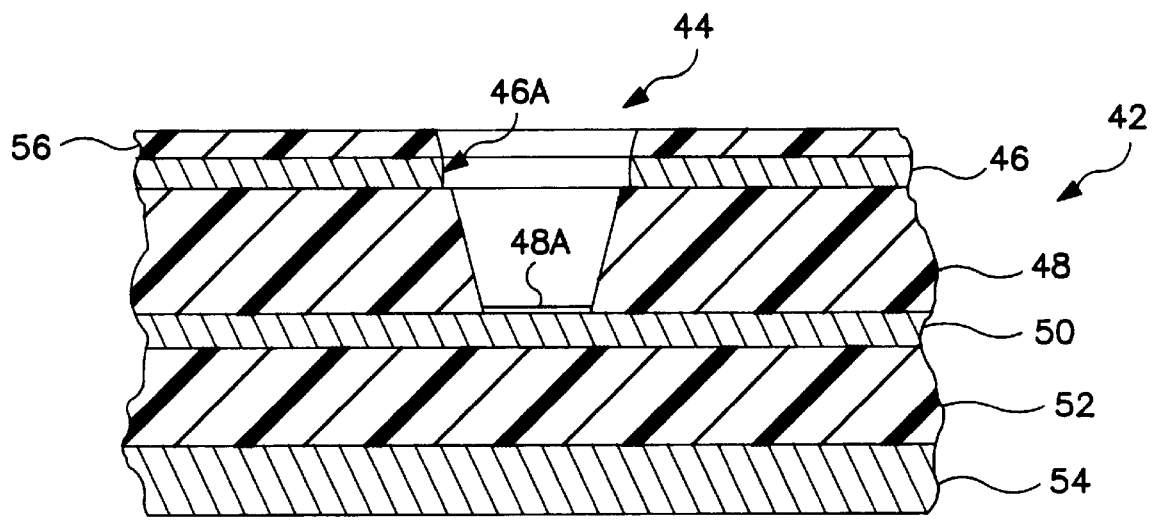
FIGS. 4A and 4B are sectional views showing a multi-layered substrate having a blind-via formed therein, with FIGS. 4A and 4B showing different stages of development of the blind-via.

Referring to FIG. 4A, a laminated multilayered substrate 42 includes a blind-via 44. Typically, blind-vias are formed through only one dielectric layer and are used for routing connections between two adjacent conductive layers. However, blind-vias can be formed that go through a plurality of laminated substrate layers in order to connect multi-conductive layers.

As seen in FIG. 4A, laminated substrate 42 includes an outer conductive layer 46 having a preformed aperture 46a formed at the location where blind-via 44 is to be formed. Substrate 42 further includes a dielectric layer 48, a conductive layer 50, a dielectric layer 52 and a conductive layer 54. Aperture 46a is formed by conventional means, such as by a chemical etching process, so that dielectric layer 48 is exposed through aperture 46a. In particular, conductive layer 46 is coated with a photo-absorptive material, and then the photo-absorptive materials are imaged with a pattern for aperture 46a. The imaged photo-absorptive layer is developed and the exposed portion of conductive layer 46 is chemically etched to form aperture 46a.

After aperture 46a is formed, the photo-absorptive material used to image conductive layer 46 and form opening 46a can be left on, rather than being etched away, to leave a polymeric photo-absorptive layer 56 on conductive layer 46. Photo-absorptive layer 56 is between 5 µm and 50 µm thick and, preferably, is nominally 25 µm thick. Suitable photo-absorptive materials are any of a variety of commercially available photoresists.

With photo-absorptive layer 56 in place, substrate 42 is then placed on the positioning table 34 of FIG. 2. The laser beam is positioned so that laser focal spot is focused to a predetermined spot size inside of aperture 46a where blind-via 44 is to be drilled. The output power level, the pulse repetition frequency, the pulse length or duration and laser focal spot size are adjusted accordingly so that an energy density per pulse is applied to substrate 42, and more specifically, to dielectric layer 48, that is greater than an ablation energy density threshold of dielectric layer 48, but is less than an ablation energy density threshold of conductive layer 50 (located below dielectric layer 48 ).

When using a 355 nm laser source, the beam ablates material in the blind-via to a point where the beam begins to be partially reflected by the underlying conductive layer 50, and thus, further exposure to the beam forms an undesirable copper oxide due to local heating. At this point, a post-pulse processing technique is used for further processing blind-via 44 to completely remove any remaining dielectric material 48a. Complete removal provides a reduced resistance and resistance variance of via 44.

For post-pulse processing, the output power level of laser 22 is increased in situ over the drilled via to an energy density level per pulse that exceeds the ablation threshold of conductive layer 50 by adjusting the energy density of the laser beam. The number of pulses and peak power of each pulse applied to conductive layer 50 at the increased energy density is selected so that the surface of conductive layer 50 at the bottom of blind-via 44 becomes molten, but is not rapidly ablated and drilled. Since the energy density per pulse has been increased, the remaining dielectric layer 48a is completely ablated.

The material from dielectric layer 48 that is ablated during laser drilling is vaporized and pulled through a local source of exhaust, or is redeposited on polymeric photo-absorptive layer 56 surrounding aperture 46a. After via 44 achieves the depth shown in FIG. 4A, photo-absorptive layer 56 and the ablated material redeposited thereon are removed using known techniques, such as chemically stripping.

For the initial drilling of a blind-via, laser source 22 (FIG. 2) can be adjusted to have a desired power output and pulse repetition frequency, such as between 1 KHz and 15 KHz, inclusive.

When the laser is a tripled Nd:YAG laser emitting at a wavelength of 355 nm, the energy density per pulse applied to dielectric layer 48 (FIG. 4A) is between 0.5 J/cm$^2$ and 11 J/cm$^2$, and preferably is nominally 5 J/cm$^2$. When dielectric layer 48 is made of an ePTFE matrix material, the energy density per pulse is preferably between 3 J/cm$^2$ and 4 J/cm$^2$. When dielectric layer 48 includes a filler, the energy density per pulse is preferably about 7 J/cm$^2$. When the laser emits at a 355 nm wavelength, the laser is preferably adjusted to have a pulse repetition frequency of 6000 Hz, a pulse width of 70 ns, and a spot size of 35 µm for a 50 µm diameter via entrance. Pulse widths, as used herein, neglect rise and fall times of a pulse. Spot sizes, as used herein, are approximately 1/e$^2$ sizes. Other pulse repetition frequencies may also be used with pulse widths that are typically less than 100 ns, as long as a sufficient energy density per pulse for ablating dielectric layer 48 is applied.

When the laser is a quadrupled Nd:YAG laser emitting at a wavelength of 266 nm, the energy density per pulse applied to dielectric layer 48 is between 0.2 J/cm$^2$ and 3 J/cm$^2$, and preferably is nominally 2 J/cm$^2$. When the laser emits at a 266 nm wavelength, it is preferably adjusted to have a pulse repetition frequency of 7000 Hz, a pulse width of 78 ns, and a spot size of 30 µm for a 50 µm diameter via mask entrance. Other pulse repetition frequencies may also be used with pulse widths that are typically less than 100 ns as long as a sufficient energy density per pulse for ablating dielectric layer 48 is applied.

The laser beam is preferably applied to dielectric layer 48 within aperture 46a without trepanning, that is, moving the laser focal spot as the blind-via is being drilled. Alternatively, the laser focal spot can be trepanned in a circular motion within aperture 46a to form a via having a circular cross-section. Specifically, the focal spot is initially focused to the center point of where the via is to be drilled. As the laser is pulsed, lens 28 and table 34 move in a coordinated fashion so that the focal spot is spirally trepanned outward to a circle having a predetermined diameter, and then trepanned around the circle for as many times as are needed to drill the via, and then spirally trepanned back to the center point before the operating conditions of the laser are changed, or the focal spot is moved to another via. The rate of trepan and the corresponding spacing between each pulse is related to the pulse repetition frequency and the per-pulse power level output from the laser, For post-pulse processing, the laser power density, repetition rates, and pulse lengths are varied according to specific needs and drilling operations. Some representative values for different lasers for blind-via post-pulse processing are provided in detail hereinafter.

When the laser 22 is a tripled Nd:YAG laser emitting at a wavelength of 355 nm, the energy density per pulse applied to conductive layer 50 for post-pulse processing is greater than 5.5 J/cm$^2$, and preferably is nominally 11 J/cm$^2$. At this wavelength, the laser is adjusted to have a pulse repetition frequency of 4000 Hz, and a pulse length of 55 ns. A focal spot size of 35 µm is employed. Typically, between 1 and 10 pulses, inclusively, are used for 355 nm post-pulse processing. Other pulse repetition frequencies may also be used with pulse widths that are typically less than 100 ns as long as a sufficient energy density per pulse for ablating conductive layer 50 is applied to conductive layer.

When the laser 22 is a quadrupled Nd:YAG laser emitting at a wavelength of 266 nm, the energy density per pulse applied to conductive layer 50 is greater than 1.5 J/cm$^2$, and preferably is nominally 5 J/cm². When the laser 22 emits at a 266 nm wavelength, the laser beam is preferably adjusted to have a pulse repetition frequency of 5000 Hz, a pulse length of 63 ns, and a spot size of 30 μm. Similarly, between 1 and 10 pulses, inclusively, are used for 266 nm post-pulse processing. Other pulse repetition frequencies may also be used with pulse lengths that are typically less than 100 ns as long as a sufficient energy density per pulse for ablating dielectric layer 50 is applied.

Figure 4B:
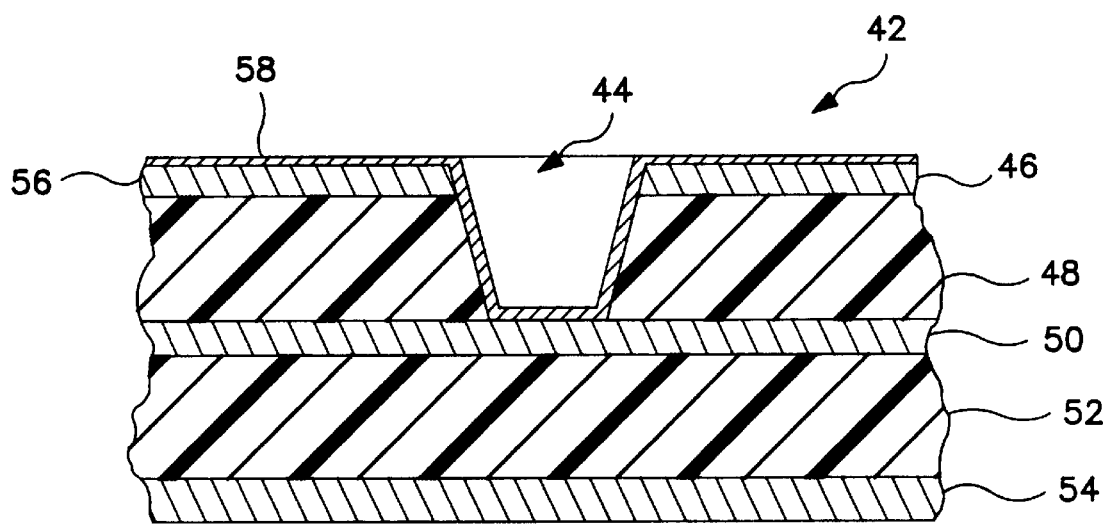

After post-pulse processing, and as shown in FIG. 4B, blind-via 44 is plated with a conductive material which forms a conductive layer 58 using known techniques such as electroless plating. This plating provides an electrical interconnection between the two adjacent conductive layers 46 and 50.

Blind-vias post-pulse processed have a reduced average resistance after the conductive material is plated into the blind-via as compared to blind-vias that have not been post-pulse processed. When vias not receiving the post-pulse processing, an average resistance of a blind-via was measured at about 3 mΩ. With post-pulse processing, a comparably produced blind-via had an average resistance of about 2 mΩ.

Tables 3–12 set forth results of a test in which multiple panels of laminated substrates were laser drilled for producing blind-vias having via entrance diameters of 50 μm and an aspect ratio of 1:1 in a Speedboard® C dielectric material, using a quadrupled Nd:YAG laser emitting at a 266 nm wavelength and with a 25 μm spot size. The experimental matrix was a full factorial design comprising 108 blind-via laser conditions. Each group of vias per laser drilled conditions used one of three laser output energy levels, 175 mW, 200 mW and 225 mW. Power was set for the laser rail at 3000 Hz. Each group of blind-vias was subdivided into 3 subgroups that were drilled at one of three pulse repetition frequencies, 6000 Hz, 7000 Hz and 8000 Hz. Pulse width varied between 70 ns for 6000 Hz to 85 ns for 8000 Hz, so that between 5 μJ per pulse and 15 μJ per pulse was applied to the dielectric. Each subgroup of vias was further subdivided into 3 sub-sub groups that were drilled using one of three predetermined number of pulses, 75, 150 and 225. One half of each sub-subgroup was post-pulse processed, while the other half was not post-pulse processed. Post-pulse processing changed the laser conditions in situ over a blind-via so that about 25 μJ per pulse was applied to the substrate.

The average resistance for both panels for all conditions was measured to be 2.83 mΩ. The average resistance for both panels for non-post-pulse processed blind-vias was measured to be 3.22 mΩ. The average resistance for both panels for post-pulse processed blind-vias was measured to be 2.43 mΩ. Table 3 sets forth the average resistance measured for each of the three different energy levels. Table 3 generally shows that an output energy level of 175 mW did not sufficiently ablate all dielectric material from a blind-via, resulting in a higher measured resistance.

TABLE 3

| POWER SETTING LEVEL @ 3000 Hz (mW) | AVERAGE RESISTANCE (mΩ) |
| --- | --- |
| 175 | 4.11 |
| 200 | 2.26 |
| 225 | 2.11 |

Table 4 sets forth the average resistance measured for each of the three different pulse repetition frequencies. Table 4 shows that a higher pulse repetition frequency, with a correspondingly longer pulse width and lower power level, did not sufficiently ablate the dielectric material from a blind-via, resulting in a higher measured resistance.

TABLE 4

| PULSE REPETITION FREQUENCY (Hz) | AVERAGE RESISTANCE (mΩ) |
| --- | --- |
| 6000 | 1.73 |
| 7000 | 2.23 |
| 8000 | 4.51 |

Table 5 sets forth the average resistance measured for each of the three different predetermined number of pulses used for drilling a via. Table 5 shows that when 75 pulses were used for drilling a via for all output energy levels, the dielectric material was not sufficiently ablated from a blind-via, resulting in a higher measured resistance.

TABLE 5

| NUMBER OF PULSES | AVERAGE RESISTANCE (mΩ) |
| --- | --- |
| 75 | 3.89 |
| 150 | 2.36 |
| 225 | 2.22 |

Table 6 sets forth the average resistance measured for no post-pulse processing and for post-pulse processing. Table 6 shows that post-pulse processing decreased the average resistance for all output energy levels and all pulse repetition frequencies used.

TABLE 6

| POST-PULSE PROCESSING | AVERAGE RESISTANCE (mΩ) |
| --- | --- |
| NO | 3.22 |
| YES | 2.43 |

Table 7 sets forth the average resistance measured as a function of output energy level and pulse repetition frequency. Table 7 shows that a lower pulse repetition frequency, with a correspondingly shorter pulse width and higher power level, provided a lower average resistance.

TABLE 7

| POWER SETTING LEVEL @ 3000 Hz (mW) | PULSE REPETITION FREQUENCY (Hz) | AVERAGE RESISTANCE (mΩ) |
| --- | --- | --- |
| 175 | 6000 | 1.82 |
| 175 | 7000 | 2.51 |
| 175 | 8000 | 7.99 |
| 200 | 6000 | 1.66 |
| 200 | 7000 | 2.11 |
| 200 | 8000 | 3.00 |
| 225 | 6000 | 1.71 |
| 225 | 7000 | 2.08 |
| 225 | 8000 | 2.54 |

Table 8 sets forth the average resistance measured as a function of output energy level and number of pulses used. Table 8 shows that a lower output energy level and a lower number of pulses used for drilling provided a higher average resistance.

TABLE 8

| POWER SETTING LEVEL @ 3000 Hz (mW) | NUMBER OF PULSES | AVERAGE RESISTANCE (mΩ) |
|---|---|---|
| 175 | 75 | 6.93 |
| 175 | 150 | 2.83 |
| 175 | 225 | 2.56 |
| 200 | 75 | 2.53 |
| 200 | 150 | 2.17 |
| 200 | 225 | 2.07 |
| 225 | 75 | 2.23 |
| 225 | 150 | 2.09 |
| 225 | 225 | 2.03 |

Table 9 sets forth the average resistance measured as a function of whether post-pulse processing was used. Table 9 shows that use of post-pulse processing decreased average resistance for all output energy levels used.

TABLE 9

| POWER SETTING LEVEL @ 3000 Hz (mW) | POST-PULSE PROCESSING | AVERAGE RESISTANCE (mΩ) |
|---|---|---|
| 175 | NO | 4.89 |
| 175 | YES | 3.31 |
| 200 | NO | 2.49 |
| 200 | YES | 2.02 |
| 225 | NO | 2.27 |
| 225 | YES | 1.96 |

Table 10 sets forth the average resistance measured as a function of pulse repetition frequency and whether post-pulse processing was used. Table 10 show that post-pulse processing decreased the average resistance for all ncies used.

TABLE 10

| PULSE REPETITION FREQUENCY (Hz) | POST-PULSE PROCESSING | AVERAGE RESISTANCE (mΩ) |
|---|---|---|
| 6000 | NO | 1.83 |
| 6000 | YES | 1.64 |
| 7000 | NO | 2.41 |
| 7000 | YES | 2.06 |
| 8000 | NO | 5.42 |
| 8000 | YES | 3.60 |

Table 11 sets forth average resistance measured as a function of number of pulses and whether post-pulse processing was used. Table 11 shows that post-pulse processing decreased the average resistance for the different total number of pulses used.

TABLE 11

| NUMBER OF PULSES | POST-PULSE PROCESSING | AVERAGE RESISTANCE (mΩ) |
|---|---|---|
| 75 | NO | 4.58 |
| 75 | YES | 3.21 |
| 150 | NO | 2.61 |
| 150 | YES | 2.11 |
| 225 | NO | 2.46 |
| 225 | YES | 1.98 |

Table 12 sets forth the standard deviation for the average resistance measured for whether post-pulse processing was used. Table 12 shows that post-pulse processing reduced the standard deviation of resistances measured by a factor of 3.

TABLE 12

| POST-PULSE PROCESSING | AVERAGE RESISTANCE (mΩ) |
|---|---|
| NO | 1.54 |
| YES | 0.54 |

While the laser power density, repetition rates, and pulse widths can be varied according to specific needs and drilling operations, some representative values for the 355 nm Nd:YAG laser with a 35 µm spot size are provided as follows in Table 13.

TABLE 13

| Dielectric Material | Energy per Pulse (µJ) | Energy Density (J/cm$^2$) | Power Density (MW/cm$^2$) |
|---|---|---|---|
| CE-epoxy/PTFE | 30 | 3.5 | 35 |
| post-pulse | 100 | 11 | 200 |
| CE-epoxy/PTFE/ceramic filler | 65 | 7.0 | 100 |
| post-pulse | 100 | 11 | 200 |

Similarly, for the 266 nm wavelength Nd:YAG laser, representative values for forming a blind-via with a 30 Pm focal spot are as follows in Table 14.

TABLE 14

| Dielectric Material | Energy per Pulse (µJ) | Energy Density (J/cm$^2$) | Power Density (MW/cm$^2$) |
|---|---|---|---|
| CE-epoxy/PTFE | 10 | 1.5 | 20 |
| post-pulse | 20 | 3 | 40 |

For dielectric materials having ceramic filler, higher values are required. For instance, the energy density applied to conductive layer 50 is greater than 4 J/cm$^2$, and preferably is nominally 9 J/cm$^2$. These values correspond to a pulse repetition frequency of 5000 Hz, a pulse length of 55 ns, and a spot size of 30 µm. For the post-pulse step, between 1 and 10 pulses, inclusively, are used. Other pulse repetition frequencies may also be used with pulse lengths that are typically less than 100 ns as long as a sufficient energy density per pulse for ablating dielectric layer 50 is applied.

Forming blind-vias according to the methodology described above minimizes damage to the mask (layer 30 in FIG. 2), as well as the copper oxide layers associated with conductive layers 2a, 2b, 5a and 6a of FIG. 1 and those that would be associated with conductive layers 50 and 54 of FIG. 4A and 4B, the latter being excluded from illustration for clarity. The minimized damage results from minimizing the amount of peak power used for drilling a via. The copper oxide layer is not partially etched back when the laminated substrate is cleaned after laser drilling in an acidic cleaner, thus resulting in a more reliable via because the copper and dielectric layers in the substrate remain adhered to each other in the vicinity of the via.

Methods For Forming Through-Vias

It is possible to drill through-vias having entrance diameters of 75 µm or less and aspect ratios of between 3:1 and 25:1.

Figure 5A:
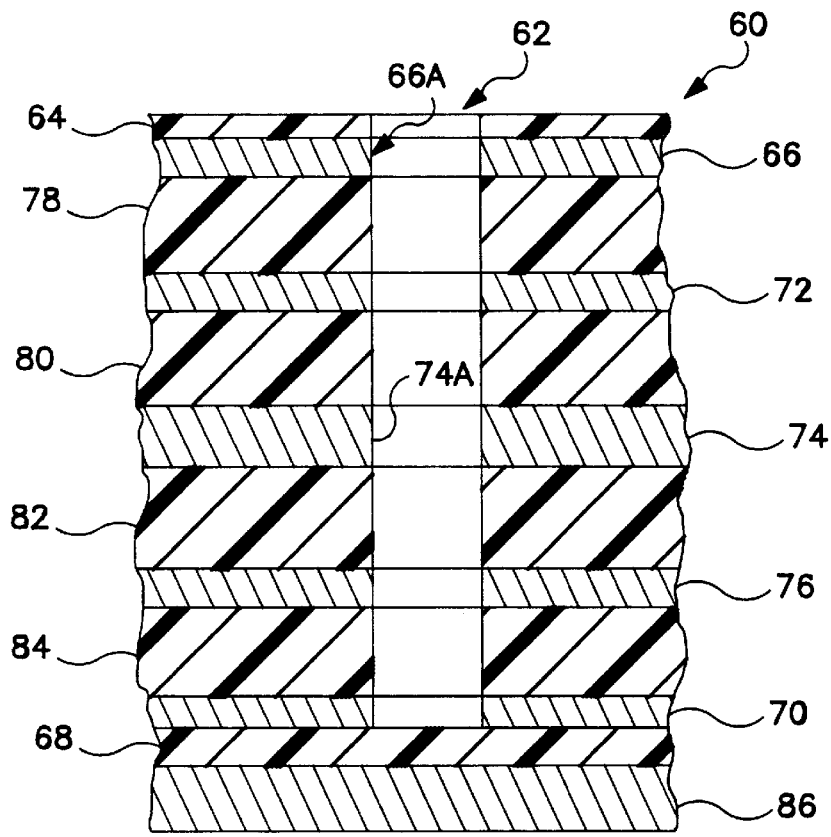
FIGS. 5A and 5B are sectional views showing a through-via in different stages of development.

Referring to FIG. 5A, a laminated substrate 60 is shown with a through-via 62 passing through alternating layers of dielectric and conductive layers. When the through-via 62 is drilled, the conductive and the dielectric layers are drilled at the same time, as described below.

Laminated substrate 60 in FIG. 5A is formed with a polymeric photo-absorptive coating 64 on an upper most conductive layer 66. This photo-absorptive coating is the same type described with respect to FIG. 4A, and can be applied using a roll lamination, a spray coating, or a spin-coating technique, for example. Coating 64 is between 5 $\mu$m and 50 $\mu$m thick and, preferably, nominally 25 $\mu$m thick. Suitable photo-absorptive materials for the coating are commercially available. When the photo-absorptive layer is removed after laser drilling, the via entrance is of high-quality since ablated material deposits on layer 64 and is removed.

To form a via exit of high quality, that is, a low exit width variance, a polymeric photo-absorptive layer 68 is formed on the bottom most exposed conductive layer 70 using a known technique, such as a roll lamination, a spray coating or a spin coating process. Photo-absorptive layer 68 has a thickness of between 5 $\mu$m to 50 $\mu$m, and preferably has a nominal thickness of 25 $\mu$m. A series of intermediate alternating layers of conductive layers 72, 74, and 76 and dielectric layers 78, 80, 82 and 84 are provided between the upper most and lower most conductive layers 66 and 70.

It is important to maintain planarity of the bottom side of laminated substrate 60 during the process of laser drilling to form through-via 62. Conventional approaches of holding a laminated substrate against a screen or a honeycomb grid using a vacuum does not provide the required combination of sufficient bottom side planarity and minimal redeposit of material conformal to the bottom side of the substrate. Most vacuum plates are fabricated with aluminum or steel, thus providing a potential for redeposit of metal that is difficult to remove. In some instances, photo-absorptive layer 68 alone is sufficient for providing high-quality via exits. To ensure both an easy to remove redeposit material with via sidewalls, as well as the necessary bottom side planarity, a layer 86 made of conductive material, such as copper, is placed in intimate contact with photo-absorptive layer 68 by taping substrate 60 coated with photo-absorptive layer 68 to a flat conductive plate, such as copper.

To laser drill through-via 62 shown in FIG. 5A, substrate 60 is positioned so that the laser focal spot is focused to predetermined X and Y coordinates where through-via 62 is to be drilled. For a through-via having a 50 $\mu$m diameter, the output power level, the pulse repetition frequency, the pulse width and laser focal spot size of the laser are adjusted accordingly so that an energy density per pulse is applied to substrate 60 that is greater than an ablation energy density threshold of the conductive layers 66, 72, 76 and 70. For example, the computer of the laser system shown in FIG. 2 sets the power output and the pulse repetition frequency between 1 KHz and 15 KHz, inclusive, and a pulse length of between 40 ns and 100 ns, inclusive, utilizing a laser spot size of between 25 $\mu$m and 35 $\mu$m in diameter, for example, to ablate the layers of substrate 60.

When the laser is a tripled Nd:YAG laser emitting at a wavelength of 355 nm, the energy density per pulse applied to substrate 60 is greater than 2 J/cm$^2$, and preferably is nominally 10 J/cm$^2$. For a 355 nm wavelength output, the laser is preferably adjusted to have a pulse repetition frequency of 8000 Hz, a pulse width of 85 ns and a spot size of 35 $\mu$m. Other pulse repetition frequencies may also be used with pulse widths that are typically less than 100 ns as long as a sufficient energy density per pulse for ablating the layers of the substrate 60 is applied.

Some other representative through-via forming parameters for the 355 nm wavelength laser are as follows in Table 15:

TABLE 15

| Dielectric Material | Energy per Pulse ($\mu$J) | Energy Density (J/cm$^2$) | Power Density (MW/cm$^2$) |
| --- | --- | --- | --- |
| ceramic filled CE-epoxy/PTFE | 75 | 8 | 95 |
| CE-woven glass/CE-Epoxy/PTFE | 200 | 22 | 400 |

When the laser is a quadrupled Nd:YAG laser emitting at a wavelength of 266 nm, the energy density per pulse applied to the substrate is greater than 2 J/cm$^2$, and preferably is nominally 10 J/cm$^2$. For a 266 nm wavelength output, the laser is preferably adjusted to have a pulse repetition frequency of 5000 Hz, a pulse width of 55 ns and a spot size of 25 $\mu$m. Other pulse repetition frequencies may also be used with pulse widths that are typically less than 100 ns as long as a sufficient energy density per pulse for ablating the layers of the substrate 60 is applied. Other representative values for through-via formation using a 266 nm wavelength Nd:YAG laser with a 25 mm focal spot are as follows in Table 16.

TABLE 16

| Dielectric Material | Energy per Pulse ($\mu$J) | Energy Density (J/cm$^2$) | Power Density (MW/cm$^2$) |
| --- | --- | --- | --- |
| ceramic filled CE-epoxy/PTFE | 50 | 10 | 150 |

To form the through-via of FIG. 5A, the laser beam is preferably applied to substrate 60 in a trepanned motion as was described with respect to formation of the blind-via. This results in the formation of a through-via having a circular cross-section. The trepanning motion continues for as long as is necessary to drill the through-via, and then the focal spot is spirally trepanned back to the center point before the operating conditions of the laser are changed, or focal spot is moved to another via. To form a 50 $\mu$m diameter via, the center of a 25 $\mu$m diameter focal spot is trepanned in a 40 $\mu$m diameter circular pattern at a trepanning distance of 0.8 to 6 $\mu$m between pulses.

Figure 5B:
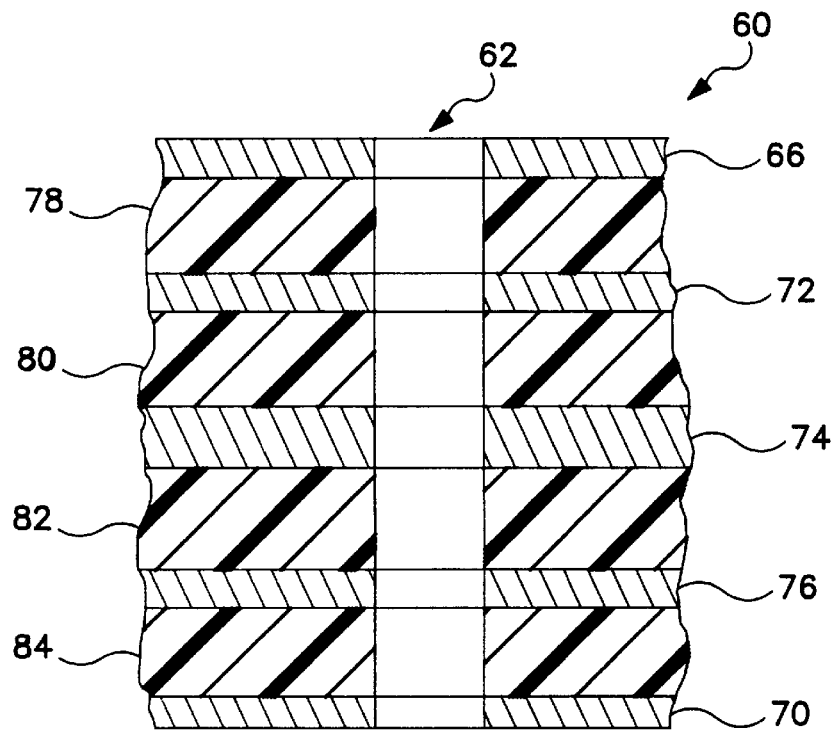

When through-via 62 is drilled through to the bottom side of substrate 60, minimal redeposit on the sidewalls occurs due to the high UV-VIS (ultraviolet-visible) absorptivity of the polymer coating on the via exit and conductive layer 86 after ablation-redeposit. Once drilling is complete, conductive layer 86 is separated from substrate 60 and photo-absorptive layer 68 is stripped away using known techniques. Also, photo-absorptive coating 66 is stripped, resulting in substrate 60 shown in FIG. 5B.

Use of photo-absorptive layer 68 formed on the bottom surface of substrate 60 and conductive layer 86 held in intimate contact with the substrate ensures the formation of through-vias having a low exit width variance. For example, for through-vias having an aspect ratio of about 10:1, an exit width variance of about 20 $\mu$m$^2$ has been measured. As another example, an exit width variance of about of about 30 $\mu$m$^2$ has been measured for through-vias having an aspect ratio of about 20:1.

Multi-frequency Processing And Multiple Pulse Spacing

Many times when a through-via is initially drilled, the via exit opening at the bottom conductive layer 70 (FIG. 5A and 5B) is smaller than the via entrance opening at the upper conductive layer 66. Both nominal exit diameter and through-via exit width variance can be further improved by performing post-pulse processing. That is, the laser system output conditions are changed in situ over through-via 62 after the via is drilled in one of four ways and the laser beam is then trepanned for an additional trepanning pass typically using a smaller trepanning circle pattern.

To illustrate the four different through-via post-processing techniques, the situation where a 50 μm diameter through-via is drilled is considered. The through-via is initially drilled using an energy density per pulse of 50 μJ/pulse applied to the substrate at a pulse repetition rate of 5000 Hz, using a 25 μm spot size and a 40 μm diameter circular trepanning pattern at a trepanning distance of between pulses of 0.8 to 6 μm per pulse. In both through-via post-processing techniques, the laser output conditions are changed in situ over the through-via for avoiding tolerance build-up problems associated with repositioning the laser beam spot across the substrate and within entrances of the drilled through-vias. Re-lasing with multiple registration operations may result in severe entrance nodules and overall poor via quality.

For the first through-via post-pulse processing technique, the laser output conditions are adjusted in situ over the just-completed through-via by keeping the energy density per pulse constant at 50 μJ/pulse, the pulse repetition rate constant at 5000 Hz, the spot size constant at a 25 μm diameter, the trepanning rate constant at 0.8 to 6 μm spacing per pulse, but the trepanning pattern is reduced to be a 30 μm diameter circle.

For the second through-via post-pulse processing technique, the laser output conditions are adjusted in situ over the just-completed through-via by keeping the energy density per pulse constant at 50 μJ/pulse, the pulse repetition rate constant at 5000 Hz, the spot size constant at a 25 μm diameter, and by reducing the trepanning rate constant by a factor of 2.0 or greater to 0.4 to 3 μm spacing per pulse, and reducing the trepanning pattern to be a 30 μm diameter circle.

For the third through-via post-pulse processing technique, the laser output conditions are adjusted in situ over the just-completed through-via by increasing the energy density per pulse to 60 to 75 μJ/pulse, keeping the trepanning rate to be between 0.8 μm and 6 μm per pulse, and reducing the trepanning pattern to be a 30 μm diameter circle. This can be accomplished by changing the pulse repetition rate to approximately 4500 Hz.

For the fourth through-via post-pulse processing technique, the laser output conditions are adjusted in situ over the just-completed through-via by increasing the energy density per pulse to 60 to 75 μJ/pulse, reducing the trepanning rate by a factor of two or greater to 0.4 μm and 3 μm per pulse, and reducing the trepanning pattern to be a 30 μm diameter circle.

Through-via post-pulse processing provides a significant improvement in open through-via yield, while also providing an even further improved through-via exit width variance when compared to through-vias that are not post-pulse processed. For example, when the aspect ratio of the through-via is 5:1, a variance of about 5 μm² is achieved. Similarly, when the aspect ratio of the through-via is 10:1, a variance of the exit width of the through-via of about 10 μm² is achieved using through-via post-pulse processing. Similarly, when the aspect ratio of the through-via is 20:1, a variance of the exit width of the through-via of about 15 μm is achieved.

The taper of the sidewalls of a via can be varied and is a function of the power level used to drill a via and the materials used in the substrate, the pulse step distance, and the total energy per via. Taper, for purposes of this disclosure is defined as:

$$TAPER = \frac{(D_1 - D_2)}{D_1}$$

where, $D_1$ is the entrance diameter of the a via, and $D_2$ is the exit diameter of the via. These diameters are shown in FIG. 1. Taper, defined in this manner, varies between 0 and 1. A taper of 0 indicates that the exit diameter equals the entrance diameter. A taper of 1 indicates that the via did not reach its destination. Taper for through-vias having an aspect ratio of 10:1 that are drilled in substrates having dielectric layers formed from paste composite dielectric materials can be formed having a taper from 0.0 to 0.4.

The laser conditions used for achieving this taper are initially drilling at a wavelength of 355 nm, an energy density per pulse of 75 μJ/pulse, a pulse repetition rate of 8000 Hz, a spot size of 35 μm, and a 40 μm diameter circular trepanning pattern at a trepanning rate of 2 μm to 3 μm between pulses. The resulting taper is approximately 0.3. Through-via post-pulse processing by either alternative discussed above can be used after the initial drilling.

Through-vias having an aspect ratio of 10:1 drilled in substrates having dielectric layers formed from woven glass dielectric materials can be formed having a taper of 0.2 to 0.5. The laser conditions used for achieving this taper are initially drilling at a wavelength of 355 nm, an energy density per pulse of 200 μJ/pulse, a pulse repetition rate of 3500 Hz, a spot size of 35 μm, and a 40 μm diameter circular trepanning pattern at a trepanning rate of 4 to 6 μm per pulse. Through-via post-pulse processing by either alternative is used after the initial drilling.

When a laser emitting at a wavelength of 266 nm is used, the taper achieved for a 10:1 ratio via for substrates having a ceramic/CE-epoxy PTFE dielectric material is 0.0 to 0.2. The laser conditions used for achieving this taper are initially drilling at a wavelength of 266 nm, an energy density per pulse of 50 μJ/pulse, a pulse repetition rate of 5000 Hz, a spot size of 25 μm, and a 40 μm diameter circular trepanning pattern at a trepanning rate of 2 μm to 3 μm between pulses. The resulting taper is approximately 0.1. Through-via post-pulse processing by either alternative discussed above can be used after the initial drilling.

Through-vias having an aspect ratio of 10:1 drilled in substrates having dielectric layers formed from woven glass dielectric materials can be formed having a taper of 0.1 to 0.3. The laser conditions used for achieving this taper are initially drilling at a wavelength of 266 nm, an energy density per pulse of 50–75 μJ/pulse, a pulse repetition rate of 4000–6000 Hz, a spot size of 35 μm, and a 40 μm diameter circular trepanning pattern at a trepanning rate of 1 to 6 μm per pulse. Through-via post-pulse processing by either alternative is used after the initial drilling.

Cleaning Blind-vias And Through-vias

After both blind-vias and through-vias have been laser drilled by the methods described above, and the photo-absorptive layers have been removed, a cleaning step is initiated. Since the via entrances formed by the present invention are 75 µm and less, conventional via cleaning does not remove the ablated material redeposited on the sidewalls of the vias to the degree necessary for reliably plating conductive material into the vias.

An aggressive ultrasonic treatment in de-ionized water is used to clean the vias. The ultrasonic treatment is typically carried out for between 5 and 20 minutes and is applied to the substrate for removing ablated material redeposited on sidewalls of the vias.

TEA & YAG Laser Processing

When a large number of blind-vias need to be drilled in a particular layer of a laminated substrate, that is, equal to or greater than 1500 blind-vias in an area about 45 mm$^2$, or a greater than or equivalent via density of 0.75 vias/mm$^2$, the blind -via laser processing described above can be implemented using a transversely excited atmospheric (pressure) (TEA) $CO_2$ laser in a scan mode operation for initially drilling each blind-via, and then using a solid state 3rd or 4th YAG laser in a drill mode operation for performing post-pulse processing for enhancing the qualities of each blind-via and reducing the average resistance and resistance variance of each blind-via. For example, the laser 22 of FIG. 2 can be a 60 W TEA $CO_2$ laser having a wavelength of about 9 µm to 11 µm, a pulse repetition frequency of about 150 Hz, and a pulse width of about 100 ns can be used in a scan mode operation for initially drilling 50 µm diameter blind-vias in a 50 µm thick dielectric layer. In this example, the TEA $CO_2$ laser is adjusted to apply 26 J/cm$^2$ per pulse so that the initial drilling is a 2 or 3 pulse operation per blind-via. After all blind-vias have been drilled by the TEA laser, the substrate is switched over to a suitable pulsed YAG laser for blind-via post-pulse processing for reducing the average resistance and the variance of the resistance of the vias, as described above.

Correcting Astigmatism

When a quadrupled Nd:YAG laser (wavelength equals 266 nm) is used for laser drilling, as described above, the entrance quality of the vias can be ensured by correcting for astigmatism in the laser beam. Referring again to FIG. 2, a plate 41 is interposed in the beam path between laser source 22 and substrate or workpiece 32. In particular, beam 22a passes through an aperture formed in plate 41. Plate 41 is positioned in the beam path at a point that is equal to or less than the Rayleigh range of the beam. The size of aperture 41 is selected to block the side lobes of beam 22a.

Flip-Chip Package

Figure 6:
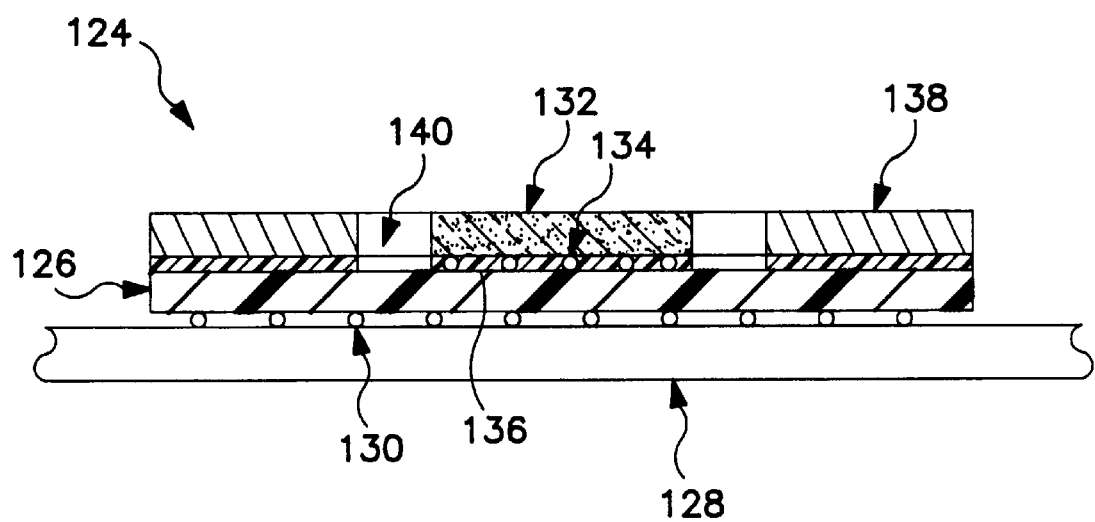
FIG. 6 shows a cross-sectional view of a flip-chip package in accordance with the teachings for the present invention.

FIG. 6 illustrates a flip-chip type chip/package system 124 made according to the present invention. System 124 includes a laminated substrate as an interconnect device 126 which is mechanically and electrically attached to a printed wiring board (PWB) 128 through an array of solder ball connections 130. The array of solder ball connections 130 may be a full array or it may be depopulated in the area under the semiconductor device 132.

Semiconductor device 132 is mechanically and electrically attached to interconnect device 126 through an array, full or depopulated, of solder ball connections 134. In addition, an underfill adhesive 136 disposed between chip 132 and interconnect device 126 reinforces the chip/interconnect device connection.

Interconnect device 126 is made of the alternating laminates of conductive layers and dielectric layers described above, and has a coefficient of thermal expansion (CTE) that nearly matches the CTE of PWB 128. Additionally, it is required that interconnect device 126 be flat and mechanically robust enough to be easily assembled. To accomplish this, a stiffener ring 138 may be adhered to interconnect device 126. Stiffener ring 138 has a cavity 140 (or cavities) for the semiconductor device and any other devices, such as capacitors, that are attached on the same surface to interconnect device 126.

In the past, interconnect devices were made of ceramic materials. As the density of interconnection on semiconductor devices increases, the solder ball connections between the interconnect device and the PWB tend to fail due to CTE mismatch. An interconnect device made in accordance with the teachings of the present invention eliminates this failure mode by closely matching the CTE of the interconnect device to the PWB.

The relative thickness of interconnection circuit device 126 of between 5 mils to 20 mils, inclusive, causes the device to be adversely affected by the difference between the CTE of PWB 128 and CTE of the chip 132, and by present chip bonding and package assembly techniques. Typically, the CTE of a flip-chip PWB varies between 17 to 25 ppm, while the CTE of an integrated circuit chip is 3 ppm. The CTE of interconnection circuit device 126 is selected so that the difference between the CTE $\alpha_1$ of chip 132 and the CTE $\alpha_2$ of interconnection circuit device 126 is 20 ppm or less. Preferably, the CTE of interconnection circuit device 126 is selected to be nominally 18 ppm for minimizing adverse affects caused by the difference between the respective CTEs of PWB 128 and chip 132. In the region where interconnection circuit device 126 is bonded to chip 132, the physical characteristics of chip 132 predominate and the effective CTE of interconnection circuit device 126 is about 12. In the region where interconnection circuit device 126 is bonded to support ring 138, the characteristics of support ring 138 predominate and the effective CTE of interconnection circuit device 126 matches the CTE of PWB 128.

The CTE of interconnection circuit device 126 is dominated by the dielectric substrate material forming the device. When interconnection circuit device 126 is attached to chip 132, both device 126 and chip 132 are heated during solder reflow to typically above 180° C. Depending upon the dielectric material used for interconnection circuit device 126, the dielectric material can be heated above the glass transition temperature $T_g$ of the dielectric material, causing the CTE of the dielectric material to change by as much as three times the initial CTE of the dielectric material. Consequently, the dielectric material is selected to preferably have a $T_g$ to be 200° C. or greater so that the CTE of interconnection circuit device 126 remains nominally 20 ppm/° C. during the temperature range of the solder reflow.

Dielectric

Suitable dielectrics include, but are not limited to, polyimides and polyimide laminates, epoxy resins, epoxy resins in combination with other resin material, organic materials, alone or any of the above combined with fillers. Preferred dielectric materials include a fluoropolymer matrix, where the fluoropolymer can be PTFE, ePTFE or copolymers or blends thereof. Suitable fluoropolymers include, but are not limited to, polytetrafluoroethylene or expanded polytetrafluoroethylene, with or without an adhesive filler mixture.

Preferred materials include Speedboard® bond plies available from W. L. Gore and Associates, Inc., such as, Speedboard® C which is a prepreg of non-woven material containing a cyanate ester resin in a polytetrafluoro-ethylene matrix. Speedboard® C has a dielectric constant, (Dk) of 2.6–2.7 at 1 MHz–10 GHz, a loss tangent of 0.004 at 1 MHz–10 GHz, a dielectric strength greater than 1000 V/mil, a glass transition ($T_g$) of 220° C., a resin content of 66–68 wt. % and is available in a variety of thicknesses. Also Speedboard® N prepreg, which is a prepreg of a non-woven material containing a multi-functional epoxy adhesive, in an expanded PTFE matrix may also be used. Speedboard® N has a dielectric constant, (Dk) of 3.0 at 1 MHz, a loss tangent of 0.02 at 1 MHz, a dielectric strength greater than 900 V/mil, a glass transition ($T_g$) of 140° C., a resin content of 66–68 wt. % and is available in a variety of thicknesses.

Another suitable dielectric is an expanded PTFE matrix that includes a mixture of at least two of a cyanate ester compound, an epoxy compound, a bis-triazine compound and a poly (bis-maleimide) resin. For example, a varnish solution is made by mixing 5.95 pounds of M-30 (Ciba Geigy), 4.07 pounds of RSL 1462 (Shell Resins, Inc.), 4.57 pounds of 2, 4, 6-tribromophenyl-terminated tetrabromo-bisphenol A carbonate oligomer (BC-58) (Great Lakes Inc.), 136 g bisphenol A (Aldrich Company), 23.4 g Irganox 1010, 18.1 g of a 10% solution of Mn HEX-CEM in mineral spirits, and 8.40 kg MEK. The varnish solution was further diluted into two separate baths –20% (w/w) and 53.8% (w/w). The two varnish solutions were poured into separate impregnation baths, and an e-PTFE web was successively passed through each impregnation bath one immediately after the other. The varnish was constantly agitated so as to insure uniformity. The impregnated web was then immediately passed through a heated oven to remove all or nearly all the solvent and partially cure the adhesives, and was collected on a roll. The ePTFE web may be any desired thickness, such as 25 $\mu$m, 40 $\mu$m, for example. A 25 $\mu$m thick material has a mass of approximately 0.9 g and a weight per area of approximately 11.2 to 13.8 $g/m^2$ Other classes of dielectric materials include those where a porous matrix system contains an imbibed or impregnated adhesive-filler mixture. The porous matrix is a non-woven substrate that is imbibed with high quantities of filler and a thermoplastic or thermoset adhesive, as a result of the initial void volume of the substrate, heated to partially cure the adhesive and form a B-stage composite. Substrates include fluoropolymers, such as the porous expanded polytetrafluoroethylene material of U.S. Pat. Nos. 3,953,566 and 4,482,516, each of which is incorporated herein by reference. Desirably, the mean flow pore size (MFPS) should be between about 2 to 5 times or above that of the largest particulate, with a MFPS of greater than about 2.4 times that of the filler being particularly preferred. However, it is also within the scope of the invention that suitable composites can be prepared by selecting the mean flow particle size MFPS to average particle size ratio to be greater than 1.4. Acceptable composites can also be prepared when the minimum pore size to average particle size is at least above 0.8 or the minimum pore size to the maximum particle size is at least above 0.4. The MFPS to particle size ratio ratios being performed with a microtrak FRA analyzer.

Alternatively, another mechanism for gauging relative pore and particle sizes may be calculated as the smallest pore size being not less than about 1.4 times the largest particle size.

In addition to expanded fluoropolymer substrates, porous expanded polyolefins, such as ultra high molecular weight (UHMW) polyethylene, expanded polypropylene, polytetrafluoroethylene made prepared by paste extrusion and incorporating sacrificial fillers, porous inorganic or organic foams, microporous cellulose acetate, can also be used.

The porous substrate has an initial void volume of at least 30%, preferably at least 50%, and most preferably at least 70%, and facilitates the impregnation of thermoset or thermoplastic adhesive resin and particulate filler paste in the voids while providing a flexible reinforcement to prevent brittleness of the overall composite and settling of the particles.

The filler comprises a collection of particles when analyzed by a Microtrak® Model FRA Partical Analyzer device, which displays a maximum particle size, a minimum particle size and an average particle size by way of a histogram.

Suitable fillers to be incorporated into the adhesive include, but are not limited to, $BaTiO_3$, $SiO_2$, $Al_2O_3$, ZnO, $ZrO_2$, $TiO_2$, precipitated and sol-gel ceramics, such as silica, titania and alumina, non-conductive carbon (carbon black) and mixtures thereof. Especially preferred fillers are $SiO_2$, $ZrO_2$, $TiO_2$ alone or incombination with non-conductive carbon. Most preferred fillers include filler made by the vapor metal combustion process taught in U.S. Pat. No. 4,705,762, such as, but not limited to silicon, titanium and aluminum to produced silica, titania, and alumina particles that are solid in nature, i.e., not a hollow sphere, with a uniform surface curvature and a high degree of sphericity.

The fillers may be treated by well-known techniques that render the filler hydrophobic by silylating agents and/or agents reactive to the adhesive matrix, such as by using coupling agents. Suitable coupling agents include, silanes, titanates, zirconates, and aluminates. Suitable silylating agents may include, but are not limited to, functional silyating agents, silazanes, silanols, siloxanes. Suitable silazanes, include, but are not limited to, hexamethyidisilazane (Huls H730) and hexamethylcyclotrisilazane, silylamides such as, bis(trimethylsilyl)acetamide (Huls B2500), silylureas such as trimethylsilylurea, and silylmidazoles such as trimethylsilylimidazole.

Titanate coupling agents are exemplified by the tetra alkyl type, monoalkoxy type, coordinate type, chelate type, quaternary salt type, neoalkoxy type, cycloheteroatom type. Preferred titanates include, tetra alkyl titanates, Tyzor® TOT {tetrakis(2-ethyl-hexyl) titanate, Tyzor® TPT {tetraisopropyl titanate}, chelated titanates, Tyzor® GBA {titanium acetylacetylacetonate}, Tyzor® DC {titanium ethylacetacetonate}, Tyzor® CLA {proprietary to DuPont}, Monoalkoxy (Ken-React® KR TTS), Ken-React®, KR-55 tetra (2,2 diallyloxymethyl)butyl, di(ditridecyl)phosphito titanate, LICA® 38 neopentyl(diallyl)oxy, tri(dioctyl)pyrophosphato titanate.

Suitable zirconates include, any of the zirconates detailed at page 22 in the Kenrich catalog, in particular KZ 55-tetra (2,2 diallyloxymethyl)butyl, di(ditridecyl)phosphito zirconate, NZ-01-neopentyl(diallyl)oxy, trineodecanoyl zirconate, NZ-09-neopentyl(diallyl)oxy, tri(dodecyl) benzene-sulfonyl zirconate.

The aluminates that can be used in the present invention include, but are not limited to Kenrich®, diisobutyl(oleyl) acetoacetylaluminate (KA 301), diisopropyl(oleyl) acetoacetyl aluminate (KA 322) and KA 489.

In addition to the above, certain polymers, such as, cross-linked vinylic polymers, e.g., divinylbenzene, divinyl pyridine or a sizing of any of the disclosed thermosetting matrix adhesives that are first applied at very high dilution (0.1 up to 1.0% solution in MEK) can be used. Also, certain organic peroxides, such as, dicumylperoxide can be reacted with the fillers.

The adhesive itself may be a thermoset or thermoplastic and can include polyglycidyl ether, polycyanurate, polyisocyanate, bis-triazine resins, poly (bis-maleimide), norbornene-terminated polyimide, polynorbornene, acetylene-terminated polyimide, polybutadiene and functionalized copolymers thereof, cyclic olefinic polycyclobutene, polysiloxanes, poly sisqualoxane, functionalized polyphenylene ether, polyacrylate, novolak polymers and copolymers, fluoropolymers and copolymers, melamine polymers and copolymers, poly(bis phenycyclobutane), and blends or prepolymers thereof. It should be understood that the aforementioned adhesives may themselves be blended together or blended with other polymers or additives, so as to impact flame retardancy or enhanced toughness.

As used herein, Mean Flow Pore Size (MFPS) and minimum pore size were determined using the Coulter® Porometer II (Coulter Electronics Ltd., Luton UK) which reports the value directly. Average particle size and largest particle size were determined using a Microtrac light scattering particle size analyzer Model No. FRA (Microtrac Division of Leeds & Northup, North Wales, Pa., USA). The average particle size (APS) is defined as the value at which 50% of the particles are larger. The largest particle size (LPS) is defined as the largest detectable particle on a Microtrac histogram. Alternatively, the largest particle size is defined at the minimum point when the Microtrak FRA determines that 100% of the particulate have passed.

Table 17 shows the effect of the relationship of the substrate mean flow pore size (MFPS) and particulate size. When the ratio of the mean flow pore size (MFPS) to largest particulate is 1.4 or less, poor results are observed. In this case, a homogeneous composite is not observed, and most of the particulate filler does not uniformly penetrate the microporous substrate. When the ratio of the MFPS to largest particulate is greater than about 2.0, then a uniform composite is obtained. It is also observed that the larger the ratio of MFPS to largest particulate, the greater the relative case it is to imbibe a homogeneous dispersion into the microporous substrate.

weight percent PTFE and 30 weight percent epoxy adhesive. Several plies of the adhesive sheet were laid up between copper foil and pressed at 600 psi in a vacuum-assisted hydraulic press at temperature of 225° C. for 90 min. then cooled under pressure. This resulted in a copper laminate having dielectric constant of 19.0, and withstood a 30 sec. solder shock at 280° C. at an average ply thickness of 100 mm (0.0039"(3.9 mil)) dielectric laminate thickness.

DIELECTRIC EXAMPLE 2

A fine dispersion was prepared by mixing 386 g $SiO_2$ (HW-11-89, Harbison Walker Corp.) which was pretreated with phenyltrimethoxysilane (04330, Huls/Petrarch) into a manganese catalyzed solution of 200 g bismaleimide triazine resin (BT206OBJ, Mitsubishi Gas Chemical) and 388 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible composite. Several plies of this prepreg were laid up between copper foil and pressed at 250 psi in a vacuum-assisted hydraulic press at temperature of 225° C. for 90 min. then cooled under pressure. This resulting dielectric thus produced comprised of 53 weight percent $SiO_2$, 5 weight percent PTFE and 42 weight percent adhesive, displayed good adhesion to copper, dielectric constant (at 10 GHz) of 3.3 and dissipation factor (at 10 GHz) of 0.005.

DIELECTRIC EXAMPLE 3

A fine dispersion was prepared by mixing 483 g $SiO_2$ (HW-11-89) into a manganese-catalyzed solution of 274.7 g bismaleimide triazine resin (BT2060BJ, Mitsubishi Gas Chemical) and 485 g MEK. The dispersion was constantly agitated so as to insure uniformity. A swatch of 0.0002" thick expanded PTFE was then dipped into the resin mixture, removed, and then dried at 165° C. for 1 min. under tension

TABLE 17

| Sample | Substrate Pore Size Min (μm) | Substrate Pore Size MFPS (μm) | Particle Size Avg (μm) | Particle Size Max (μm) | MFPS ÷ Part$_{Avg}$ | Pore$_{Min}$ ÷ Part$_{Max}$ | Pore$_{Min}$ ÷ Part$_{Avg}$ | Result |
|---|---|---|---|---|---|---|---|---|
| A | 4 | 7 | 5 | 10 | 1.4 | 0.4 | 0.8 | Poor |
| B | 4 | 5 | 5 | 10 | 1.0 | 0.4 | 0.8 | Poor |
| C | — | 58 | 5 | 10 | 12.4 | N/A | — | Good |
| D | 18 | 32 | 6 | 10 | 5.3 | 1.8 | 3.0 | Good |
| E | 18 | 32 | 1 | 1 | 32.0 | 18.0 | 18 | Good |
| F | 17 | 24 | 6 | 10 | 4.0 | 1.7 | 2.8 | Good |
| G | 0.2 | 0.4 | 0.5 | 1.6 | 0.8 | 0.125 | 0.4 | Poor |
| H | — | 60 | 18 | 30 | 3.3 | — | — | Good |
| I | 14 | 11 | 0.5 | 1.6 | 22.0 | 8.8 | 28 | Good |
| J | 14 | 29 | 4 | 8 | 7.3 | 1.8 | 3.5 | Good |
| K | 14 | 29 | 5 | 10 | 5.8 | 1.4 | 2.8 | Good |

DIELECTRIC EXAMPLE 1

A fine dispersion was prepared by mixing 281.6 g $TiO_2$ (TI Pure R-900, Du Pont Company) into a 20% (w/w) solution of a flame retarded dicyanamide/2-methylimidazole catalyzed bisphenol-A based polyglycidyl ether (Nelco N-4002-5, Nelco Corp.) in MEK. The dispersion was constantly agitated so as to insure uniformity. A swatch of expanded PTFE was then dipped into the resin mixture. The web was dried at 165° C. for 1 min. under tension to afford a flexible composite. The partially-cured adhesive composite thus produced comprised of 57 weight percent $TiO_2$, 13 to afford a flexible composite. Several plies of this prepreg were laid up between copper foil and pressed at 250 psi in a vacuum-assisted hydraulic press at temperature of 225° C. for 90 minutes then cooled under pressure. The resulting dielectric thus produced comprised of 57 weight percent $SiO_2$, 4 weight percent PTFE and 39 weight percent adhesive, displayed good adhesion to copper, dielectric constant (at 10 GHz) of 3.2 and dissipation factor (at 10 GHz) of 0.005.

DIELECTRIC EXAMPLE 4

A fine dispersion was prepared by mixing 15.44 kg $TiO_2$ powder (TI Pure R-900, DuPont Company) into a manganese-catalyzed solution of 3.30 kg bismaleimide triazine resin (BT206OBH, Mitsubishi Gas Chemical) and 15.38 kg MEK. The dispersion was constantly agitated so as to insure uniformity. A swatch of 0.0004" $TiO_2$-filled expanded PTFE (filled according to the teachings of Mortimer U.S. Pat. No. 4,985,296, except to 40% loading of $TiO_2$ and the membrane was not compressed at the end) was then dipped into the resin mixture, removed, and then dried at 165° C. for 1 min. under tension to afford a flexible composite. The partially cured adhesive composite thus produced comprised of 70 weight percent $TiO_2$, 9 weight percent PTFE and 21 weight percent adhesive. Several plies of this prepreg were laid up between copper foil and pressed at 500 psi in a vacuum-assisted hydraulic press at temperature of 220° C. for 90 minutes then cooled under pressure. This resulting dielectric displayed good adhesion to copper, dielectric constant of 10.0 and dissipation factor of 0.008.

DIELECTRIC EXAMPLE 5

A fine dispersion was prepared by mixing 7.35 kg $SiO_2$ (ADMATECHS SO-E2, Tatsumori LTD) with 7.35 kg MEK and 73.5 g of coupling agent, i.e., 3-glycidyloxypropyltrimethoxysilane (Dynasylan GLYMO (Petrach Systems). SO-E2 is described by the manufacture as having highly spherical silica having a particle diameter of 0.4 to 0.6 mm, a specific surface area of 4–8 $m^2/g$, a bulk density of 0.2–0.4 g/cc (loose).

To this dispersion was added 932 g of a 50% (w/w) solution of a cyanated phenolic resin, Primaset PT-30 (Lonza Corp.). In (MEK) methylethylketone, 896 g of a 50% (w/w) solution of RSL 1462 (Shell Resins, Inc.(CAS #25068-38-6)) in MEK, 380 g of a 50% (w/w) solution of BC-58 (Great Lakes, Inc.) in MEK, 54 g of 50% solution of bisphenol A (Aldrich Company) in MEK, 12.6 g Irganox 1010 (Ciba Geigy), 3.1 g of a 0.6% solution of Manganese 2-ethylhexanoate (Mn HEX-CEM (OMG Ltd.), and 2.40 kg MEK. This dispersion was subjected to ultrasonic agitation through a Misonics continuous flow cell for about 20 minutes at a rate of about 1–3 gal./minute. The fine dispersion thus obtained was further diluted to an overall bath concentration of 11.9% solids (w/w).

The fine dispersion was poured into an impregnation bath. A expanded polytetrafluoroethylene web having the node fibril structure of FIG. 12, and the following properties:

| | |
|---|---|
| Frazier | 20.55 |
| Coverage | 9 g/m$^2$ |
| Ball Burst | 3.2 lbs. |
| Thickness | 6.5 mil. |
| Mean Flow Pore Size | 9.0 microns |

The Frazier number relates to the air permeability of the material being assayed. Air permeability is measured by clamping the web in a gasketed fixture which is provided in circular area of approximately 6 square inches for air flow measurement. The upstream side was connected to a flow meter in line with a source of dry compressed air. The downstream side of the sample fixture was open to the atmosphere. Testing is accomplished by applying a pressure of 0.5 inches of water to the upstream side of the sample and recording the flow rate of the air passing through the in-line flowmeter (a ball-float rotameter that was connected to a flow meter.

The Ball Burst Strength is a test that measures the relative strength of samples by determining the maximum at break. The web is challenged with a 1 inch diameter ball while being clamped between two plates. The Chatillon, Force Gauge Ball/Burst Test was used. The media is placed taut in the measuring device and pressure afixed by raising the web into contact with the ball of the burst probe. Pressure at break is recorded.

The web described above was passed through a constantly agitated impregnation bath at a speed at or about 3 ft./min, so as to insure uniformity. The impregnated web is immediately passed through a heated oven to remove all or nearly all the solvent, and is collected on a roll.

Several plies of this prepreg were laid up between copper foil and pressed at 200 psi in a vacuum-assisted hydraulic press at temperature of 220° C. for 90 minutes and then cooled under pressure. This resulting dielectric displayed good adhesion to copper, dielectric constant (10 GHz) of 3.0 and dissipation factor of 0.0085 (10 GHz).

The physical properties of the particulate filler used in Example 4 and Example 7 are compared below.

| Property | Tatsumori (ADMATECHS) | Harbison Walker |
|---|---|---|
| Manufacture Technique | Vapor Metal Combustion | Amorphous Fused Silica |
| Designation | Silica SO-E2 | HW-11-89 |
| Median Particle Size | 0.5 micron | 5 micron |
| Shape | Spherical | Irregular, jagged |
| Surface Area | 6–10 m$^2$/g | 10 m$^2$/g |
| Bulk Density | 0.47 g/cc | 1.12 g/cc |
| Specific Density | 2.26 g/cc | 2.16 g/cc |

DIELECTRIC EXAMPLE 6

An ePTFE matrix containing an impregnated adhesive filler mixture, based on $SiO_2$ prepared from the vapor combustion of molten silicon is prepared as follows. Two precursor mixtures were initially prepared. One being in the form of a slurry containing a silane treated silica similar to that of Example 5 and the other an uncatalyzed blend of the resin and other components.

Mixture I

The silica slurry is a 50/50 blend of the SO-E2 silica of Example 5 in MEK, where the silica contains a coated of silane which is equal to 1% of the silica weight. To a five gallon container, 17.5 pounds of MEK and 79 grams of silane were added and the two components mixed to ensure uniform dispersion of the silane in the MEK. Then, 17.5 pounds of the silica of Example 5 were added. Two five gallon containers of the MEK-silica-silane mixture were added to a reaction vessel, and the contents, i.e., the slurry, was recirculated through an ultrasonic disperser for approximately one hour to break up any silica agglomerates that may be present. The sonication was completed and the contents of the reaction vessel were heated to approximately 80° C. for approximately one hour, while the contents were continuously mixed. The reacted mixture was then transferred into a ten gallon container.

Mixture II

The desired resin blend product is an MEK based mixture containing an uncatalyzed resin blend (the adhesive) contains approximately 60% solids, where the solid portion is an exact mixture of 41.2% PT-30 cyanated phenolic resin, 39.5% RSL 1462 epoxy resin, 16.7% BC58 flame retardant, 1.5% Irganox 1010 stabilizer, and 1% bisphenol A co-catalyst, all percentages by weight.

Into a ten gallon container, 14.8 pounds of PT-30 and 15–20 pounds of MEK were added and stirred vigorously to completely solvate the PT-30. Then 6 pounds of BC58 were measured and added to the MEK/PT-30 solution and vigorously agitated to solvate the BC58. The stabilizer, 244.5 grams of Irganox 1010 and bisphenol A, 163 grams were added. The ten gallon container was reweighed and 14.22 pounds of RSL 1462 were added. Additional MEK was added to bring the mixture weight to 60 pounds. The contents were then vigorously agitated for approximately 1 to 2 hours, or as long is necessary to completely dissolve the solid components.

The desired product is a mixture of the silica treated with a silane, the uncatalyzed resin blend, and MEK in which 68% by weight of the solids are silica, and the total solids are between 5% and 50% by weight of the mixture. The exact solids concentration varies from run to run, and depends in part on the membrane to be impregnated. The catalyst level is 10 ppm relative to the sum of the PT-30 and RSL1462.

The solid contents of mixtures I and II were determined to verify the accuracy of the precursors and compensate for any solvent flash that had occurred. Then mixture I was added to a ten gallon container to provide 12 pounds of solids, e.g., 515 solids content, 23.48 pounds of mixture I. Then mixture II was added to the container to provide 5.64 pounds of solids, e.g., 59.6% solids, 9.46 pounds of mixture II. the manganese catalyst solution (0.6% in mineral spirits), 3.45 grams, was added to the mixture of mixture I and mixture II and blended thoroughly to form a high solids content mixture.

The bath mixture for impregnating an ePTFE matrix, 28% solids mixture, was prepared by adding sufficient MEK to the high solids content mixture to a total weight of 63 pounds.

Thereafter, an ePTFE matrix was impregnated with this bath mixture to form a dielectric material.

DIELECTRIC EXAMPLE 7

A fine dispersion was prepared by mixing 26.8 grams Furnace Black (Special Schwarz 100, Degussa Corp., Ridgefield Park, N.J.) and 79 grams of coupling agent (Dynaslan GLYMO CAS #2530-83-8; 3-glycidyloxypropyl-trimethoxysilane (Petrach Systems). The dispersion was subjected to ultrasonic agitation for 1 minute, then added to a stirring dispersion of 17.5 pounds $SiO_2$ (SO-E2) in 17.5 pounds MEK which had previously been ultrasonically agitated. The final dispersion was heated with constant overhead mixing for 1 hour at reflux, then allowed to cool to room temperature.

Separately, an adhesive varnish was prepared by adding the following: 3413 grams of a 57.5% (w/w) mixture of Primaset PT-30 in MEK, 2456 grams of a 76.8% (w/w) mixture of RSL 1462 in MEK, 1495 grams of a 53.2% (w/w) solution of BC58 (Great Lakes, Inc.) in MEK, 200 grams of 23.9% (w/w) solution of bisphenol A (Aldrich Company) in MEK, 71.5 grams Irganox 1010, 3.21 grams of a 0.6% (w/w) solution of Mu HEX-CEM (OMG Ltd.) in mineral spirits, and 2.40 kg MEK.

In a separate container, 3739 grams of the dispersion described above was added, along with 0.0233 grams of Furnace Black (Special Schwarz 100, Degussa Corp., Ridgefield Park, N.J.), 1328 grams of the adhesive varnish described above and 38.3 pounds MEK. This mixture was poured into an impregnation bath, and an ePTFE web was passed through the impregnation bath at a speed at or about 3 ft/min. This dispersion was constantly agitated so as to insure uniformity. The impregnated web is immediately passed through a heated oven to remove all or nearly all the solvent, and is collected on a roll.

Several piles of this prepeg were laid up between copper foil and pressed at 200 psi in a vacuum-assisted hydraulic press at temperatures of 200° C. for 90 minutes then cooled under pressure. This resulting dielectric displayed good adhesion to copper.

DIELECTRIC EXAMPLE 8

An adhesive varnish was prepared by adding the following: 3413 grams of a 57.5% (w/w) solution of Primaset PT-30 (PMN P-88-1591)) in MEK, 2456 grams of a 76.8% (w/w) solution of RSL 1462 in MEK, 1495 grams of a 53.2% (w/w) solution of BC58 (Great Lakes, Inc.) in MEK, 200 grams of 23.9% (w/w) solution of bisphenol A (Aldrich Company) in MEK, 71.5 grams Irganox 1010, 3.21 grams of a 0.6% (w/w) solution of Min HEX-CEM in mineral spirits, and 2.40 kg MEK.

In a separate container, 1328 grams of the adhesive varnish described above, 42.3 pounds MEK, 6.40 grams of Furnace Black (Special Schwarz 100, Degussa Corp., Ridgefield, N.J.) and 1860.9 grams $SiO_2$ (SO-E2). This mixture was poured into an impregnation bath, and an ePTFE web was passed through the impregnation bath at a speed at or about 3 ft/min. The dispersion was constantly agitated so as to insure uniformity. The impregnated web is immediately passed through a heated oven to remove all or nearly all the solvent, and is collected on a roll.

Several piles of this prepeg were laid up between copper foil and pressed at 200 psi in a vacuum-assisted hydraulic press at temperature of 220° C. for 90 minutes then cooled under pressure. This resulting dielectric displayed good adhesion to copper.

Substrate Assembly

I Adhesive Encapsulation

Figure 8:
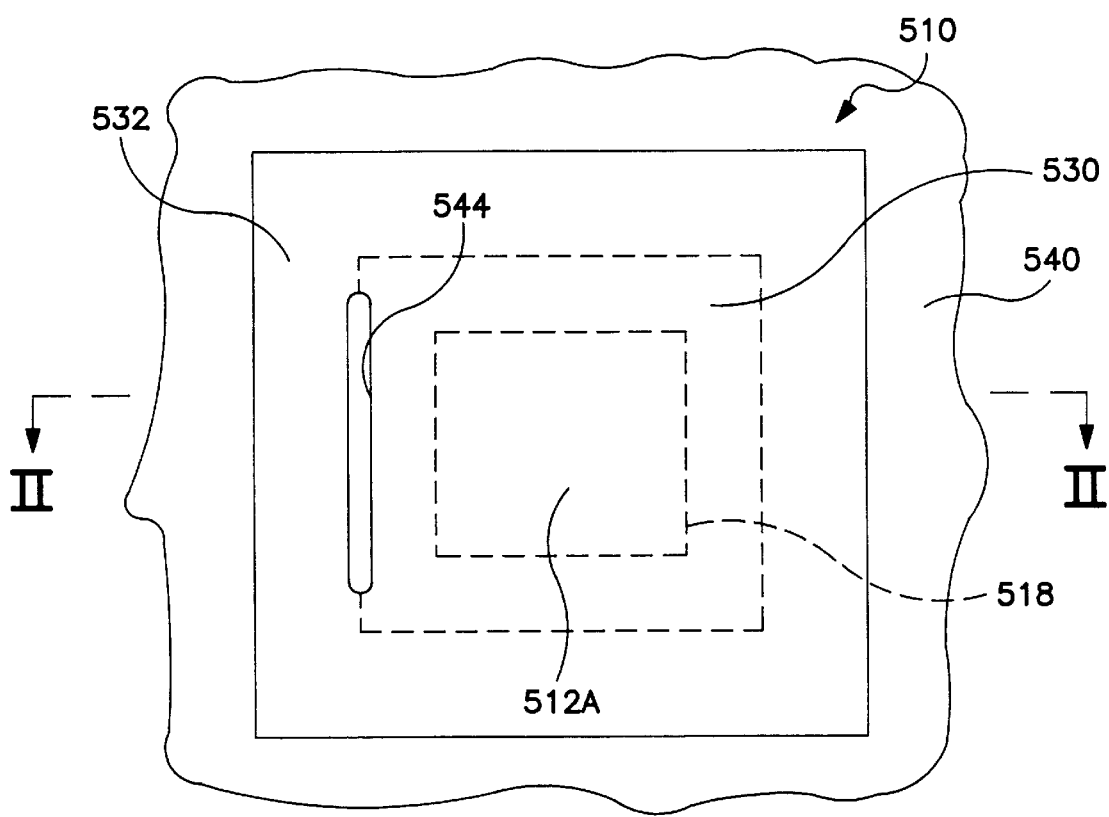
FIG. 8 is a plan view of one embodiment of a chip/package system of the present invention.
Figure 9:
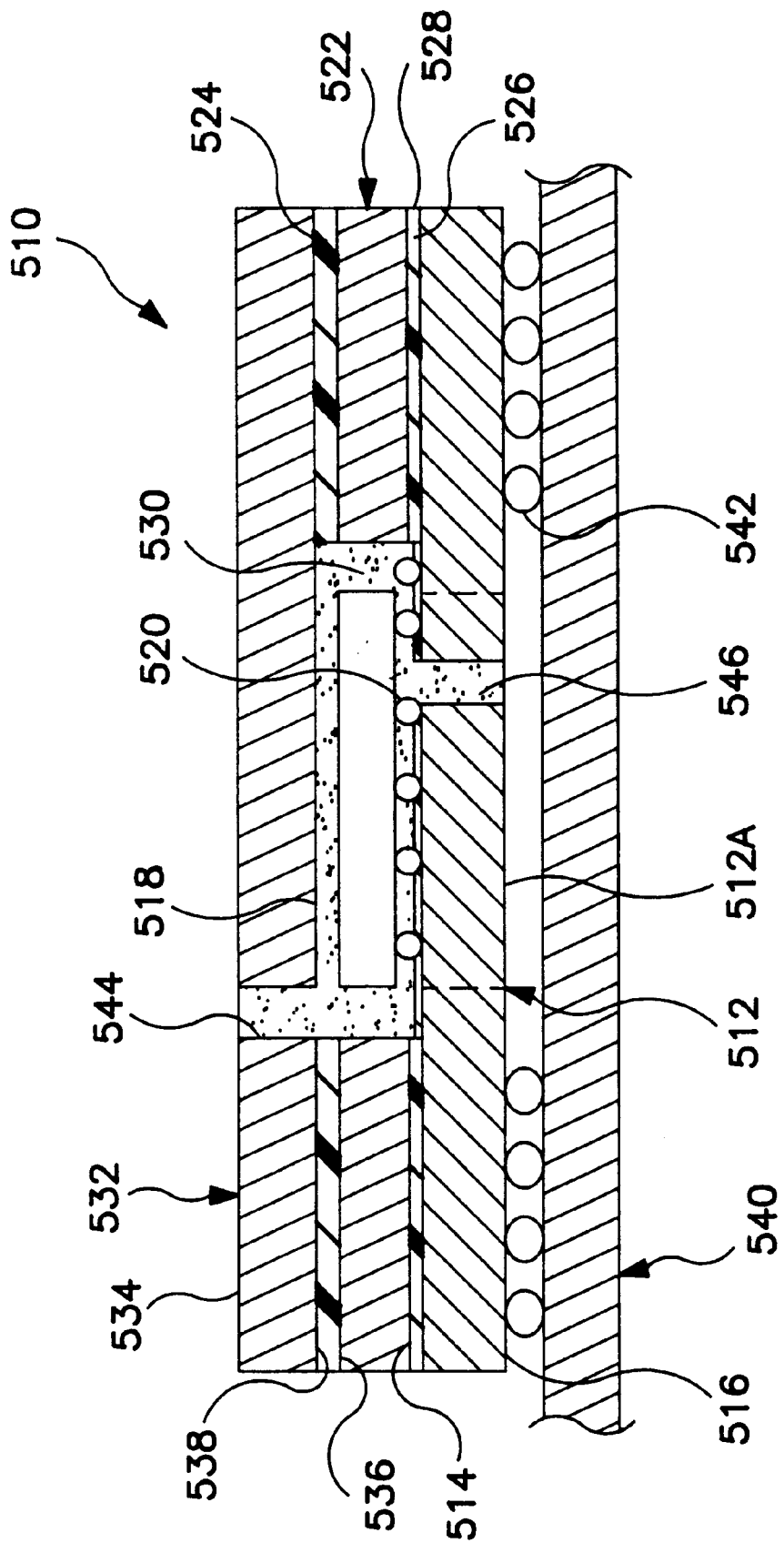
FIG. 9 is a sectional view of the chip/package system of FIG. 8, taken along line II—II of FIG. 8.

For a more complete understanding of the invention, attention is directed to FIGS. 8 and 9, in which a chip/package system 510 includes a package 512 having first and second opposite planar surfaces 514 and 516. An integrated circuit chip 518 is connectable through solder bumps or balls 520 to the surface 514 of the package 512. The solder balls 520 establish both a mechanical and electrical connection of the package 512 to the chip 518.

A constraining ring 522 having opposite surfaces 524 and 526 is bonded to the package 512 through an adhesive layer 528. The constraining ring has a centrally located rectangular opening which defines a chip-mounting cavity 530. Generally, the constraining ring 522 stiffens the package 512 to permit easier handling of the package prior to and after chip attachment and to reduce thermally-induced bending moments which result when the coefficient of thermal expansion (CTE) of the package 512 is mismatched with that of the chip 518. The thickness of the constraining ring 522 is slightly greater than the corresponding dimension of the chip 518.

A lid 532 having opposite surfaces 534 and 536 is bonded to the constraining ring 522 through an adhesive layer 538. The inner surface 538 of the lid 532 is spaced from the upper surface of the chip 518. The outer peripheral edges of the lid 532, constraining ring 522, and package 512 are co-existent and form a square. In a particular embodiment, the square measures 33 mm on each side. It is not necessary, however, for the package to be square shaped, although the square configuration is used frequently. Also, the 33 mm size is one embodiment, but other sizes can be used.

When installed in an electronic device, the chip/package system 510 is mounted on a printed wiring board (PWB) 540 through solder balls 542. As with the solder balls 520, the solder balls 542 provide electrical and mechanical connection between the package 512 and the PWB 540.

Preferably, both the package 512 and the PWB 540 are made of multi-layered laminations of alternatingly disposed dielectric and conductive layers. The preferred dielectric materials, which are organic, as well as the preferred conductive materials, will be discussed in greater detail below.

A problem in chip/package assembly arises when an adhesive underfill is applied between the lower surface of the chip 518 and the upper surface 514 of the package 512 to reinforce the mechanical connection between the package 512 and the chip 518. As the adhesive cures and shrinks, there is a tendency for the package 512 to warp, and since the chip 518 is connected to the package 512, a bending moment can be applied to the chip 518. This bending moment, if severe enough, can fracture the chip, disrupt circuits and components diffused in the chip, and/or compromise the solder ball connections between chip and the package.

One aspect of the present invention is to provide a counter or offsetting bending moment by filling the chip mounting cavity 530 with an adhesive which mechanically couples the lid 532 to the upper surface of the chip 518. The adhesive is introduced into the chip mounting cavity 530 after the lid 532 has been bonded in place on the constraining ring 522.

The adhesive is applied in a liquid state through an opening 544, which is preferably an elongated slot formed parallel to one of the four sides of the chip/package system 510. As an example of an application technique, the liquid adhesive can be applied through a needle extending into the opening 544. The tip of the needle is juxtaposed the solder ball region and the underfill adhesive is released from the tip while advancing the tip along the slotted opening 544. The adhesive migrates by capillary action to cover the area between the lower surface of the chip 518 and the upper surface of the package 512.

After the underfill adhesive is applied, the tip of the applicator or needle can be juxtaposed the space between the lower surface 538 of the lid 532 and the upper surface of the chip 518, and as the needle is again advanced along the slotted opening, capillary action draws the adhesive into this space.

The entire chip mounting cavity can be filled with the adhesive, as shown in FIG. 9, or simply the spaces between the chip 518 and surfaces of the lid 532 and package 512. As an alternative to the opening 544, or in addition thereto, an opening 546 may be formed in the package 522. If the entire cavity 530 is to be filled, there is no requirement for either opening 544 or 546 to be aligned with any one of the outer edges of the chip 518.

Opening 546 would likely be a hole, and not a slot. Moreover, two openings are generally preferred when filling the cavity with adhesive to allow air to escape during adhesive filling. The two holes can both be formed in the lid, or one can be formed in the lid and the other in the package, as depicted in FIG. 9.

Since the adhesive in contact with bond surfaces of the chip is curing simultaneously, and since the adhesive couples the chip 518 to structures on opposite sides thereof, bending moments imparted by adhesive shrinkage and CTE mismatch on one side of the chip are offset by bending moments imparted by heat shrinkage and CTE mismatch on the other side.

In conjunction with the offsetting or nulling bending moments, the package 512 and lid 532 are made of materials selected to approximately match the CTE of the two components so that the opposing bending moments are equal, but opposite.

The adhesive that is introduced into the cavity 530 is preferably thermally conductive to ensure that heat generated by the chip 518 passes from the cavity 530 to lid 532, which is likewise preferably made of a thermally conductive material.

The adhesive layers 528 and 538 can be made of any suitable adhesive material, such as, but not limited to epoxy adhesives, porous substrates impregnated with adhesives that are moisture resistant and are able to withstand temperatures in excess of 150° C., porous substrates that are impregnated with an adhesive-filler mixture that are moisture resistant and able to withstand temperatures in excess of 150° C., preferably in excess of 200° C., porous substrates that are impregnated with an adhesive-conductive particle mixture that is moisture resistant and able to withstand temperatures in excess of 150° C., preferably in excess of 200° C., e.g., Ablestik®. The adhesive layers 528 and 538 may be made of the same material or different materials. Several are commercially available, including the Ablestick ECF564 and ECF564A conductive epoxies, and GoreBond M6. The overfill and underfill adhesives can be a liquid epoxy containing $SiO_2$, e.g., Hysol 4526O. The overfill adhesives can also be solders or other metallurgical bonding agents. Other suitable materials for use as adhesive materials are described below.

The adhesive materials used for adhesive layers 528 and 538 are preferably in sheet form, while the adhesive filled in the cavity 530 is preferably in liquid form. However, the sheet adhesive layers could be replaced with liquid materials, and the liquid materials in the cavity 530 could be replaced with sheet materials, at least with respect to the area between the chip 518 and lid 532.

II Selectively Stacked Substrate Layers

Figure 10:
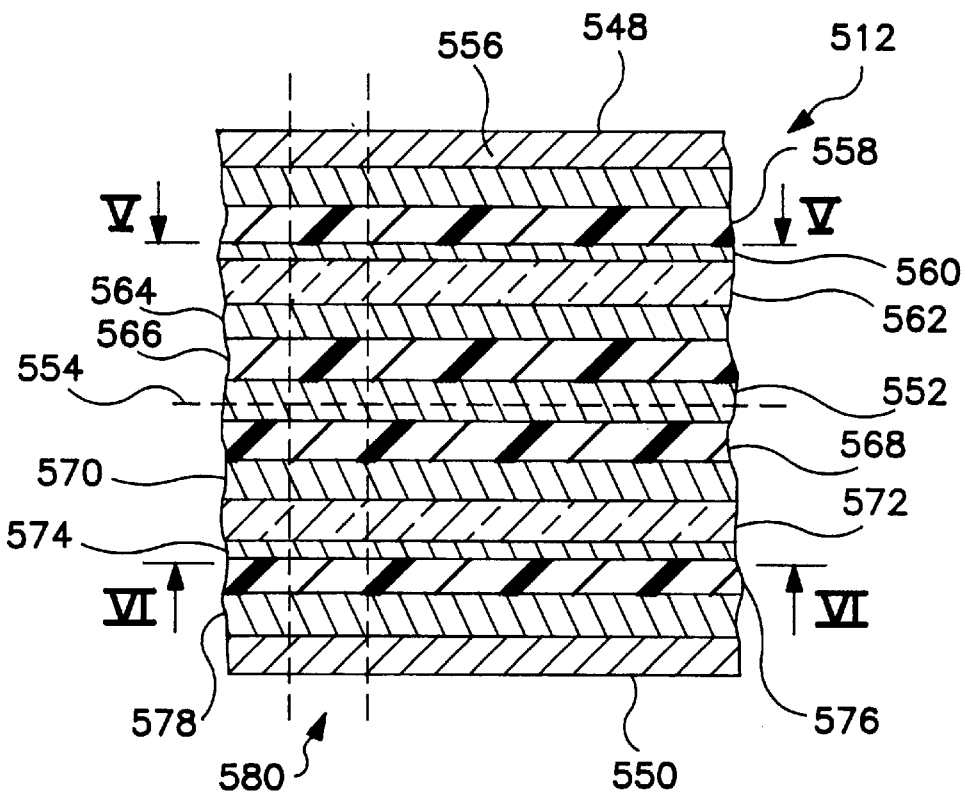
FIG. 10 is a vertical sectional view of a package component of the chip/package system of FIG. 8.

FIG. 10 is a vertical sectional view of a laminated structure for the package 512, which may be used in the chip/package system of FIG. 8. In accordance with a feature of the invention, it has been found that by using in the outer layers 556 and 578, illustratively, each layer being about a 20 $\mu$m thick layer of metal, those materials that have the least departure from the manufacturer's thickness tolerance (usually the metal layers) and by progressively adding from the outer layers 548 and 550 toward the center or core layer 552 (e.g., copper, 35 $\mu$m thick) those materials in which manufacturing thickness tolerances become progressively greater (usually the dielectric layers), the overall substrate is balanced from a thermal expansion standpoint.

The balance is such, moreover, that the curving, and its destructive effect on the chip (not shown in FIG. 10), or the ability to establish electrical contact with the chips is largely overcome.

A combination of layers, to form a suitable substrate that does not exhibit significant thermal bending within the normal range of chip operation, as shown in FIG. 10, would comprise, in order from the soldermask layer 548, inwardly toward the conductive copper center of core layer 552 through which a plane of symmetry passes:

a) 20 $\mu$m Cu/Ni/Au layer 556, a conductor;

b) 44 $\mu$m cyanate ester-epoxy-ePTFE (CE/E-ePTFE) layer 558, a dielectric;

c) 9 $\mu$m Cu layer 560, a conductor;

d) 50 $\mu$m bismalimide-triazine (BT)-Epoxy/Glass layer 562, a dielectric;

e) 18 $\mu$m Cu layer 564, a conductor; and f) 44 $\mu$m CE/E-ePTFE layer 566, a dielectric.

For example, the CE/E-epoxy-ePTFE layer 558 is prepared as follows: a varnish solution is made by mixing 5.95 pounds of M-30 (Ciba Geigy), 4.07 pounds of RSL 1462 (Shell Resins, Inc.), 4.57 pounds of 2, 4, 6-tribromophenyl-terminated tetrabromobisphenol A carbonate oligomer (BC-58) (Great Lakes Inc.), 136 g bisphenol A (Aldrich Company), 23.4 g Irganox 1010, 18.1 g of a 10% solution of Mn HEX-CEM in mineral spirits, and 8.40 kg MEK. The varnish solution was further diluted into two separate baths −20% (w/w) and 53.8% (w/w). The two varnish solutions were poured into separate impregnation baths, and an e-PTFE web was successively passed through each impregnation bath one immediately after the other. The varnish was constantly agitated so as to insure uniformity. The impregnated web was then immediately passed through a heated oven to remove all or nearly all the solvent and partially cure the adhesives, and was collected on a roll. The ePTFE web, such as that shown in FIG. 18, may be any desired thickness, such as 25 μm, 40 μm, for example. A 25 μm thick material has a weight per area of approximately 11.2 to 13.8 g/m².

As shown in FIG. 10, an identical, corresponding array of layers is provided between the outer layer 550 and the core layer 552. These include a dielectric layer 568, a conductive layer 570, a dielectric layer 572, a conductive layer 574, a dielectric layer 576, and a conductive layer 578. Note should be taken of the fact that copper layer 560 and corresponding copper layer 574 on the opposite side of the symmetry plane 554 are interspersed among the layers of CE/E-ePTFE (which has a manufacturing thickness tolerance considerably greater than the copper layers) and BT-epoxy/glass to meet the electrical needs of the apparatus, i.e., the circuit (which has a manufacturing thickness tolerance greater than CE/E-ePTFE) traces for the conductors and, as such, are not true copper layers, but are a pattern of copper conductors.

The principle of this aspect of the invention, that the better controlled thickness materials are positioned toward the outside of the package 512, and the layers with lower thickness control positioned closer to the core layer 552 must be violated occasionally, as it can be seen with respect to the CE/E-ePTFE layer 566, to satisfy the primary electrical needs of the microchip package.

Because the thicknesses of the copper layers 554, 570 and 564 can be carefully controlled and the BT-epoxy/glass and CE/E-ePTFE layer thicknesses can also be controlled, but not as well as the copper layer thicknesses, the interposition of these copper layers among the B-T epoxy/glass and CE/E-ePTFE does not aggravate the CTE response of the substrate 512, but further serves to reduce the aggregate CTE of the substrate 512. The principal feature of this aspect of the invention, consequently, is characterized in the fact that the manufacturing tolerances, and thus, the potential for departing from a predetermined layer thickness and aggravating the overall CTE response of the substrate 512 is greater for the CE/E-ePTFE layer 566, which also has the highest CTE of any of the layers, than it is for any of the other layer materials in the substrate 512.

Other appropriate layer materials can be substituted for those which are described in connection with FIG. 10, it only being necessary to arrange the layers according to the principles expressed above. For example, FR 4, a common dielectric material (or any suitable dielectric material) layer can be substituted for the BT-epoxy/glass layers shown in FIG. 10. Moreover, a greater or lesser number of layers forming the laminated package 512 can be employed.

To illustrate more clearly the improvement in the mechanical properties of the substrate 511 through the practice of this aspect of the invention, attention is invited to Table 18:

TABLE 18

|  | Prior Art Construction | FIG. 10 Construction |
|---|---|---|
| Flexural Modulus (GPa) | 6.5 to 10.3 | 19.4 to 26. |
| CTE (ppm/° C.) | 30.2 to 32.4 | 21.4 to 23.0 |
| Warpage (μm) | 388 | 83 |

[1]GPa = 10⁹ pascals, in which one pascal is equal to one newton/m².

The compositions of the layers that form the substrate 512 can be changed through a substitution of other known substrate layer materials, as noted above, it being clear that the improved performance that is provided through the invention is attained by positioning those layers with the greatest manufacturing thickness tolerances (usually the dielectrics) as the innermost layers in the substrate.

As evident from the above, the arrangement of individual layers in the laminated substrate or package 512 is selectively made to achieve dimensional control, increased flexural stiffness, and matching of CTEs within the substrate. Thus, it is important that the layers on opposite sides of the plane of symmetry are made of the same material and have the same thickness to avoid CTE differentials within the substrate. Not only is it desirable to place the metal layers on the outer layers of the laminated substrate, but it is also desirable to make the outer metal layers thicker than the inner metal layers to enhance flexural stiffness.

III Unit Area Composition Control

Another aspect of the present invention is to analyze the material composition of each layer to determine whether offsetting formations in opposing layers should be made to ensure that the CTEs of the two layers are matched.

Figure 11:
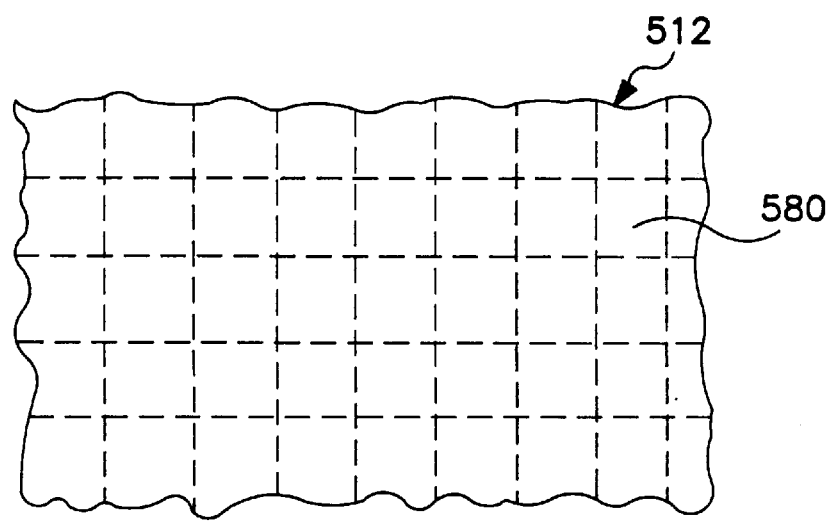
FIG. 11 is a plan view of a portion of the package, showing a grid pattern for analyzing the material content within each grid of each layer of the package.

For example, and referring to FIGS. 10 and 11, conductive layer 560 is a patterned layer that may have areas where metal has been removed to form a circuit. At an area of the layer 560 where metal is removed, a corresponding area of symmetrically disposed conductive layer 574 may have a different metal content, resulting in localized differences in CTE between the two layers 560 and 574. The differences in CTE can result in warping. The same would be true for layers formed by deposition, where more or less metal is deposited on the different but symmetrically opposed layers.

One aspect of the present invention is to analyze the material content of one layer, and then alter the opposing layer to match the material content. Referring to FIGS. 10 and 11, substrate 512 is divided into an array of unit area squares 580. These squares measure, for example, 1 mm². The squares 580 extend in space through all layers of the package so that each square of one layer has a counterpart area in a symmetrically opposed layer.

The compositions of each layer in the substrate 512 that are within the confines of each of the respective squares in the array of squares are analyzed to identify the materials and the concentrations of each of these materials in every layer of the unit area under consideration.

This concentration, or distribution of materials within each layer is developed from the original data in the design files for the layer or through analysis of the mask work for the layer. For example, as shown in FIG. 10 and 11, the copper layers 560 and 574 are not, as mentioned above, true layers, but are a distribution of conductors within the package 512 that establish appropriate conductors for the electrical connectors. To better illustrate this situation, attention now is invited to FIG. 12, which shows a plan view of the section V—V in FIG. 10.

Figure 12:
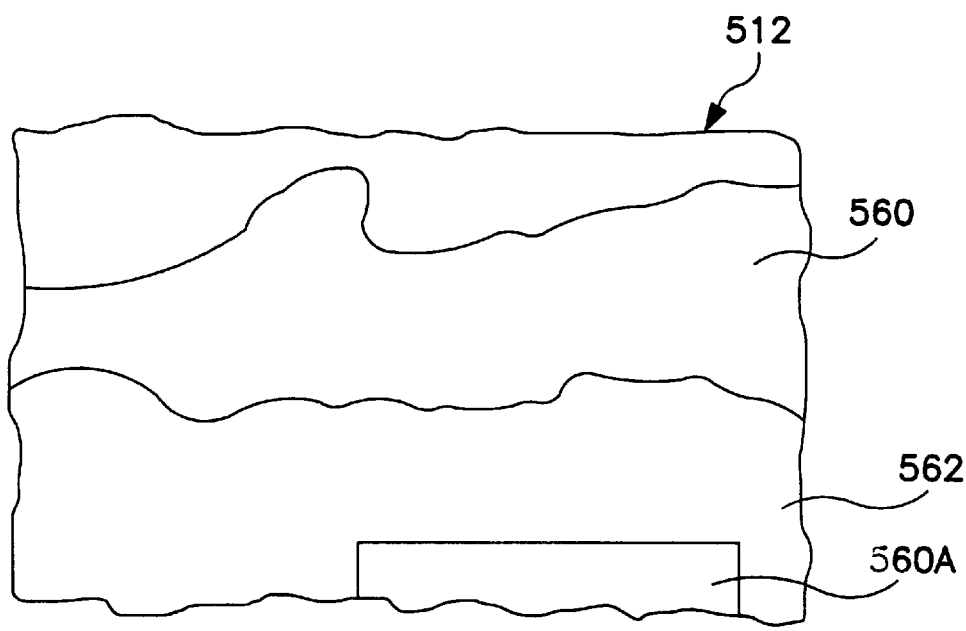
FIG. 12 is a horizontal sectional view, taken along line V—V of FIG. 10.

As shown in FIG. 12, the copper conductors that comprise the "layer" 560 do not extend across the entire area of the substrate 512, but only occupy a small non-uniform or unequally distributed portion of the copper in that area, the BT-epoxy/glass layer 562 being exposed in those portions of the plan view area of the substrate 512 that are not covered by the copper conductors which comprise the layer 560.

Figure 13:
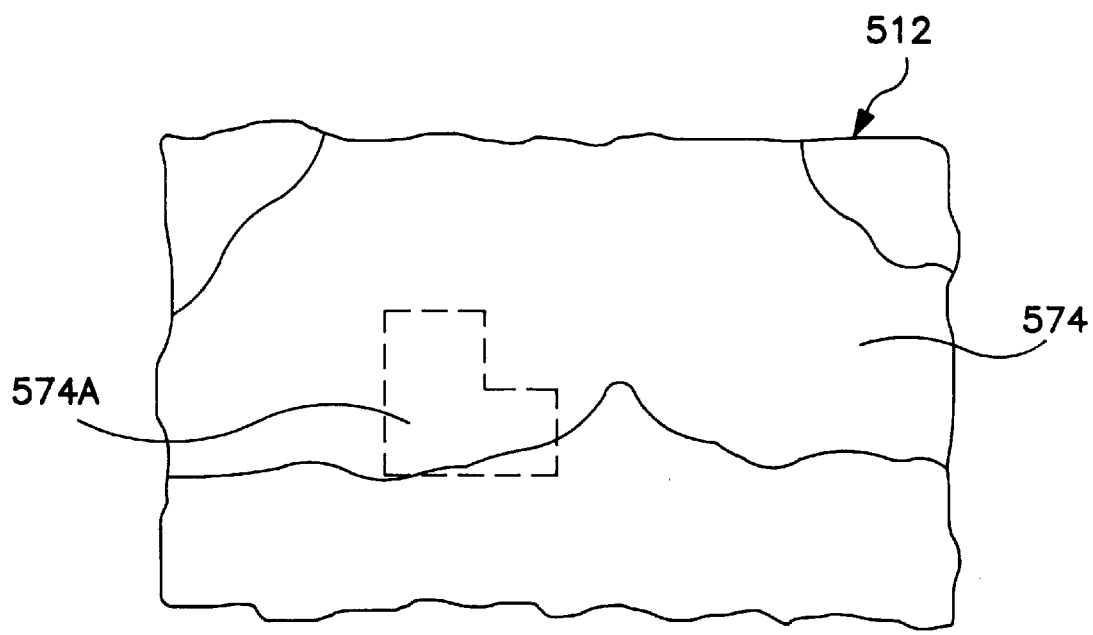
FIG. 13 is a horizontal sectional view, taken along line VI—VI of FIG. 10.

FIG. 13, in turn, shows the unequal or non-uniform disposition of the copper electrical conductors 574, and the somewhat larger concentration of copper in the conductors that form the layer 574 in comparison with respect to the quantity of copper in the layer 560.

In this manner, the illustrative copper concentration per unit area in the layers can be developed. As shown in FIG. 13, the adjusted concentrations of copper in common unit areas 580 in each of the layers 560 and 574 are not identical because of electrical circuit requirements that are imposed on these layers. The electrically inactive copper strip 560A in the layer 560 and the electrically unnecessary copper portion 574A that is removed from the layer 574 nevertheless do establish an approximate balance between the two copper electrical circuit layers 560 and 574. Warping can be reduced considerably in the substrate 512 by balancing the concentrations of the same substrate layer materials. Balancing, for this purpose, is defined as establishing equal concentrations, or void spaces on opposing pairs of layers that are at equal distances from the plane of symmetry.

For example, to balance the amount of copper in the layer 560 (FIG. 12) to approximate the quantity of copper in the companion layer 574, a strip of electrically inactive copper 560A is added to the surface of the BT-epoxy/glass layer 562. Alternatively, the relative copper concentrations also can be balanced by removing an equivalent amount of electrically unnecessary copper 574A from the electrical conductors that form the layer 574.

Of course, perfect balance can not be achieved in actual practice. Balance, for the purpose of this invention, is reached to the extent that the electrical requirements of the circuit are satisfied while nevertheless establishing as close an approximation to an equality between the respective copper concentrations in each of the layers as the physical structure will permit. Where an imbalance of bending moments exists between one opposed pair of layers, e.g., layers 560 and 574, the imbalance may be compensated for by purposely imbalancing a second pair of layers, e.g., 564 and 570, so as to create an equal and opposite bending moment.

Naturally, it is within the scope of the invention to strive for balance by using any one or more of the three foregoing techniques to approximate the desired goal.

Although a specific example of the invention is described in connection with the electrical conductor layers 560 and 574, balance, as defined for the purpose of this invention, also should be sought among the constituents that are incorporated in the Cu/Ni/Au layer 556, the CE/E-ePTFE layer 558 and the BT-epoxy/glass layer 562 through the process described above with respect to copper.

In this way, by establishing a general balance, or equality, in constituent concentrations among the layers that are within each of the unit area squares that are defined by the unit area squares 580, curving and the otherwise undesirable CTE bending moments are overcome, to a large extent.

This technique for manipulating the layer constituent materials concentration is not at all limited to the substrate 512, but can be applied successfully to all or some of the other components of chip/package system, including the lid and constraining ring.

An essential part of the foregoing is that the CTE of the opposing layers is matched locally. Thus, when using the same materials for opposing layers in a laminated structure, the areas overlying each other, meaning a common zone, has an approximately similar amount of material, either by altering one or the other, or both, of the two layers. The alternation can be in the form of material additions, such as by deposition, or material subtractions, such as by etching. The effect is the same: the package reliability is enhanced by accounting for CTE gradients across the length and width of the individual, symmetrically matched layers.

IV Die Area CTE Control

Referring again to FIGS. 8 and 9, an integrated circuit chip, such as chip 518, is typically made of a material, such as silicon, that has a substantially different coefficient of thermal expansion (CTE) as compared to an underlying package made of non-ceramic materials, such as the package 512. These differences in CTE apply stress to the solder ball connections that attach the chip 518 to the package 512.

A solution to this problem entails making the package have two different CTEs, one approximately matching that of the printed wiring board (PWB) 540 and the other approximately matching that of the chip 518. In other words, the CTE characteristics of the chip 518 are matched approximately to the CTE of the portion 512A of the substrate 512 that is directly under the chip 518.

In general, since the chip 518 has a lower CTE than that of organic packages, the portion 512A of the package will have a lower CTE than the surrounding area of the substrate. That is not to say, however, that the conditions could not be reversed, where for purposes of mounting other or different components, the center area could have a higher CTE than the surrounding area.

Creating a different CTE for the middle, chip-mounting area 512A of the package 512 can be accomplished in a variety of ways. One is to use different materials in the multi-layered structure for the central region, such that the materials themselves are chosen to provide a different CTE. The combination of layered materials for the portion 512A of the package 512 that is under the chip 518, e.g., copper, molybdenum or Invar, are selected to produce an overall CTE in the region 512A that is similar to but generally greater than the CTE of the chip 518 through the normal range of operating temperatures for both the chip 518 and the package 512. In this manner, undesirable relative movement between the chip 518 and the substrate 512 is largely eliminated.

Having approximated the CTE of the portion 512A of the package 512 to the CTE of the chip 518, it has been found, also in accordance with the invention, that the average CTE of the entire package 512 now should be matched to the CTE of the PWB 540 to which the package 512 and its attached chip 518 are joined. Failing to essentially approximate the CTE of the PWB 540 with that of the aggregate CTE for the package 512 and the chip 518 can lead to the generation of a thermally created bending and shearing movement between the PWB 540 and the package 512. The unbalanced forces thereby created between the PWB 540 and the package 512 are transferred to the chip 518 which responds to this curving and relative movement in the undesirable manner noted above, e.g., shearing the soldered electrical connections or the electrical connections between the package and the PWB 540.

In a similar manner, solder balls 542 used to make electrical connections between the package 512 and the PWB 540 also are subject to undesirable shearing events. In a typical embodiment of this aspect of the invention, the following components and their illustrative CTE characteristics that are to be reconciled are as follows:

| Component | CTE (PPM/° C.) |
|---|---|
| chip 518 | 2–3 |
| | ≈20 |
| | 16–17 |

Accordingly, the area 512A of the package 512 under the chip 518 should enjoy a CTE as close to the range of 2–3 PPM/° C. as is possible, illustratively 6 to 10 PPM/°C. The aggregate or average CTE of the package 512 also should be in the 16–17 PPM/° C. range in order to approach the printed circuit board CTE. Expressed in mathematical terms:

$$\alpha = \frac{\int\int \alpha(x, y)dxdy}{\int\int dxdy}$$

where

α=Spatially varying package 512 CTE in the x,y plane; and

α=Average CTE for the entire package 512.

The use of a different CTE for a chip-underlying portion of a package is particularly suited for flip chip packages or others employing peripheral ball grid array connectors between the package and the PWB. As seen in FIG. 9, solder balls are not used between the PWB 540 and the package 512 in the area underlying the chip cavity 530. The reason is that there will be a CTE mismatch between the area 512A of the package 512, now lowered to match the CTE of the chip 518. However, some or all of the area under the chip 518 may be populated with solder balls 542 if the relative movement between the PWB 540 and the chip/package combination can be tolerated in the specific application.

While the embodiment illustrated and described above focuses on a substrate having two discrete regions and two discrete CTEs, several additional regions could be encountered, particularly when mounting multiple chips on the package, as in multi-chip modules (MCMs). Moreover, the chip mounting region does not have to be centrally located but can be disposed virtually in any position on the package.

V Selective CTE Adjustment

Where it is desirable to have a different CTE in different regions of the package 512, as for instance, when attempting to match the CTE of the package to two different components, the CTE can be varied by physically altering the layered structure that forms the package 512.

Figure 14:
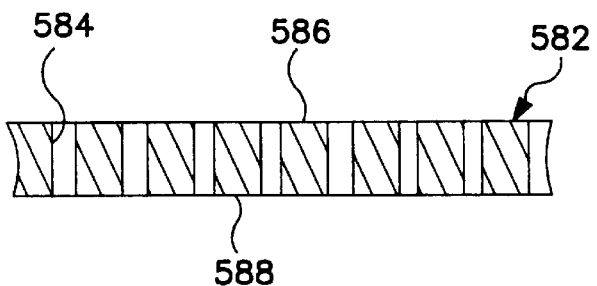
FIG. 14 is a vertical sectional view of a layer used to form the package, and showing a plurality of pre-lamination holes.

Referring FIG. 14, a core layer 582 is drilled, etched or otherwise worked to include a plurality of transversely oriented holes 584 which extend through the core layer from one surface to the opposite surface 586. The core layer 582 is one that would correspond to the core layer 552 of FIG. 10, and as with layer 552, the core layer is usually made of copper.

Figure 15:
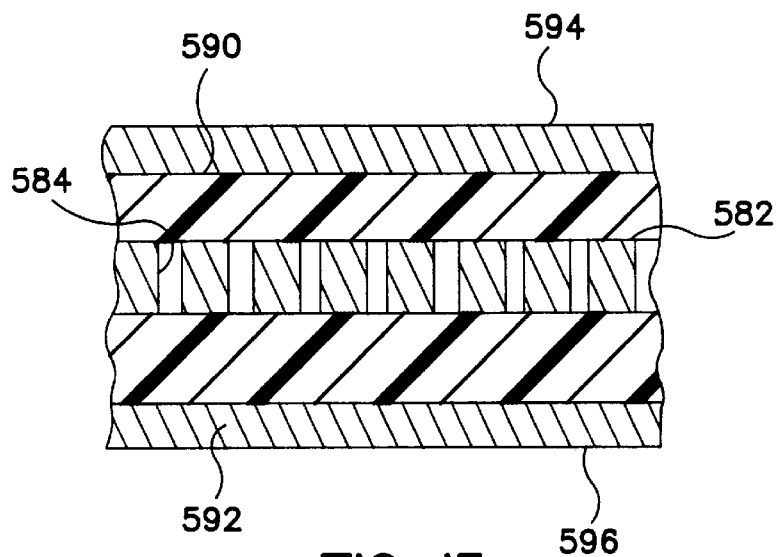
FIG. 15 is a vertical sectional view of the perforated layer in a pre-lamination stack with dielectric layers and outer conductive layers.

In FIG. 15, the core layer 582 is shown stacked between two dielectric layers 590 and 592. Typically, a lamination assembly of layers will additionally include conductive layers 594 and 596 disposed respectively on opposite sides of the dielectric layers 590 and 592.

Figure 16:
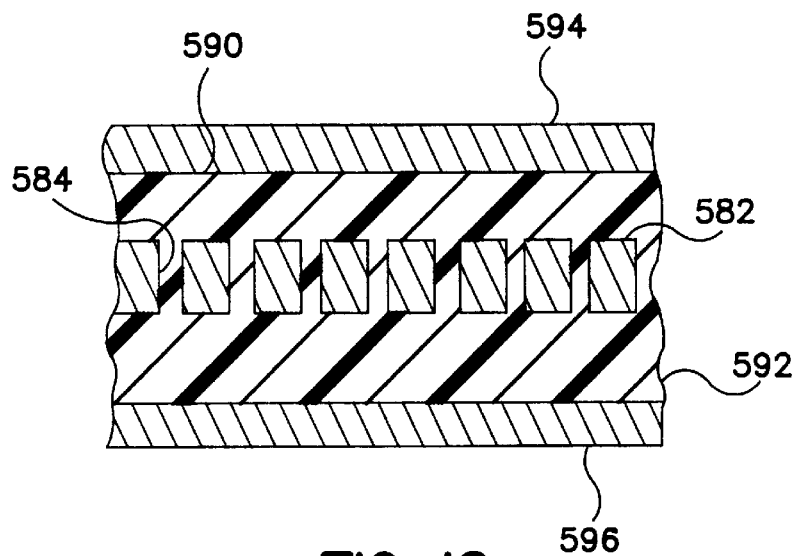
FIG. 16 is a vertical sectional view of the stack of layers of FIG. 15 after lamination, in which material from the dielectric layers flows into and fills the plurality of holes.

When the dielectric layers are made of an organic material which just before pressing is in a b-stage, the dielectric material flows into and fills the holes 584, as shown in FIG. 16. The core layer 582 thus becomes a composite which includes a copper matrix having dielectric material dispersed therethrough. The dielectric material has a higher CTE than copper and thus, the CTE of the core layer is increased where the holes 584 are present.

Alternatively, the holes 584 could be filled with any material prior to lamination to achieve a desired effect on the CTE of the package. For example, a filler having a lower CTE could fill the holes 584 as a liquid and solidified before passing the core 582 on the lamination step.

Figure 17:
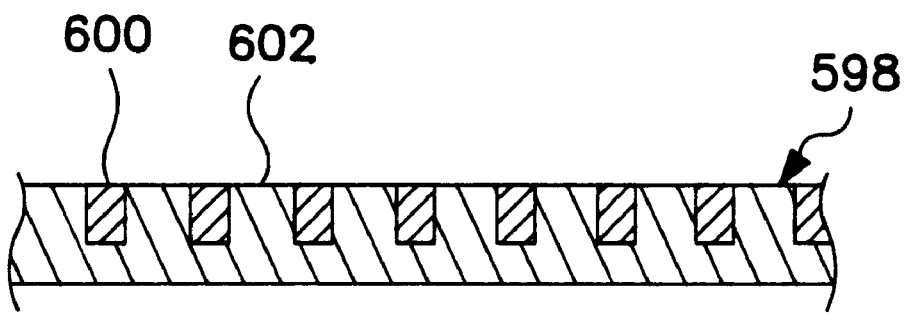
FIG. 17 is a vertical sectional view of an alternative embodiment in which the layer is grooved instead of perforated, and fill with a filler material before lamination.

As a further alternative, and referring to FIG. 17, a core layer 598 can be machined, etched or otherwise worked to form one or more grooves 600 which are filled with a filler material 602 which is selected to achieve a desired CTE change. A lower CTE filler will lower the CTE of the core 598, and a higher CTE will raise the core CTE.

Whether holes, grooves or other formations are used, the core can be worked with any number of known techniques, such as laser drilling, machining, punching, etching, etc. Moreover, the formations are not necessarily made to the core layer of a laminated package, but could be made in any layer, whether dielectric or conductive.

When making formations in layers beyond the core layers, the symmetric counterpart layers must be similarly modified. For example, in FIG. 10, if holes are to made and filled in the conductive layer 564, the same pattern of holes and same filler must be used in the same position of the symmetrically opposed conductive layer 570.

Figure 18:
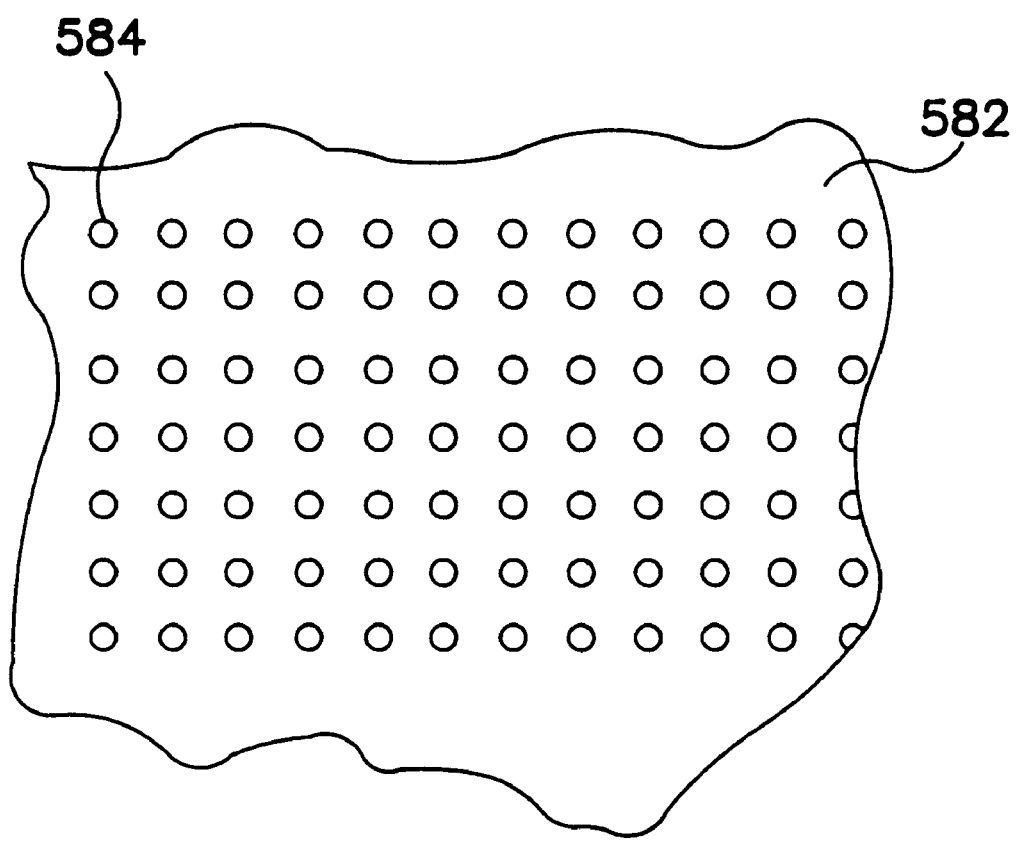
FIG. 18 is a plan view of a perforated layer, with the holes formed in a desired pattern.

As seen in FIG. 18, the holes 584 can be arranged in a grid-like pattern in the core layer 582 in a relatively tightly packed arrangement where localized changes in CTE are required. For example, to match the CTE of the package 512 in an area under the chip 518 (FIG. 9), the core layer 582 can be patterned with holes in the chip mounting area that overlies the core layer. The holes are then filled with a material that increases or decreases the CTE of the package in that area.

VI Chip Package Lid CTE Adjustment

As mentioned above, the chip 518, which can be on the order of 1 cm² to 4 cm² generates an unusual amount of heat, on occasion as much as 100 watts. To avoid degrading or even destroying the electrical characteristics of the chip 518, it is necessary to provide some means for dissipating this heat to enable the chip 518 to continue operation within an acceptable temperature.

To provide this important function of dispersing heat generated by the chip 518 to the lid 532 for subsequent dissipation, in accordance with this aspect of the invention, it has been found that using a paste of the type described in the Ameen et al. U.S. Pat. No. 5,545,473 patent and the paste dielectrics described herein provide a suitable thermally conductive, CTE matching adhesive in the volume for joining the chip 518 to the lid 532.

Another way, in accordance with a further principal of the invention, for approximating the CTE of the lid 532, in turn, to the CTE of the chip 518 and to the considerably different CTE of the constraining ring 522 and package 512 in order to reduce the degree of bending caused by mismatched CTE characteristics is through a manipulation of the material composition of the lid 532.

As mentioned above, prior art lids usually were formed from either aluminum or copper or a composite material, e.g., by adding either aluminum or copper to silicon carbide or some other low CTE reinforcement matrix. Aluminum, for instance, has a CTE of 3.7 PPM/°C. and pure silicon carbide has a CTE of 2 PPM/° C. Consequently, the potential exists for the lid 532 to enjoy a predetermined CTE anywhere in the range between 3.7 PPM/°C. for pure silicon carbide to 23 PPM/° C. for pure aluminum.

In accordance with the present invention it has been determined that the lid should be provided with different regions of CTE to match the different components of the chip/package 510 to which the lid 532 is in thermal and physical contact. This can be accomplished in a variety of ways. For example, the lid 532 can be made of a metal matrix material which includes silicon carbide and aluminum. The concentration of materials can be varied to achieve a desired two-region CTE in the lid, and in particular, the central region of the lid, corresponding positionally to the chip 518, will be configured to have a lower CTE than the surrounding region of the lid 532, which preferably is CTE matched to the higher CTE constraining ring 522.

Figure 19:
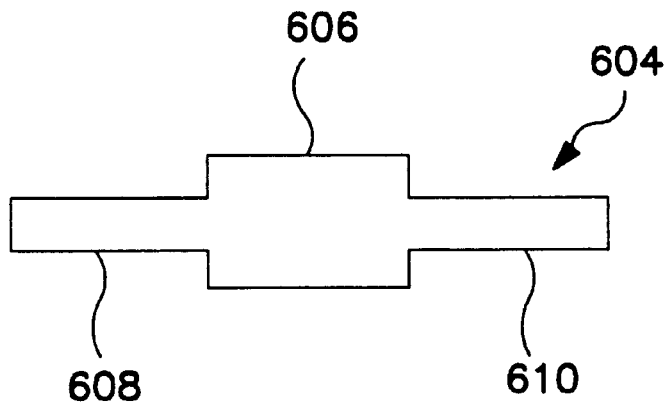
FIG. 19 is a side elevational view of a preform used to manufacture a lid having different regions of CTE.

A two-region CTE lid can be constructed in the following manner. Referring to FIG. 19, a preform 604 is made of silicon carbide powder or whiskers. The preform can be pressed to achieve a desired shaped, or can be machined or cut to form its desired shape. The desired shape is one where the middle region 606 has a thicker dimension than the outer regions 608 and 610. The preform 604 can be made using standard powder metallurgy techniques.

Figure 20:
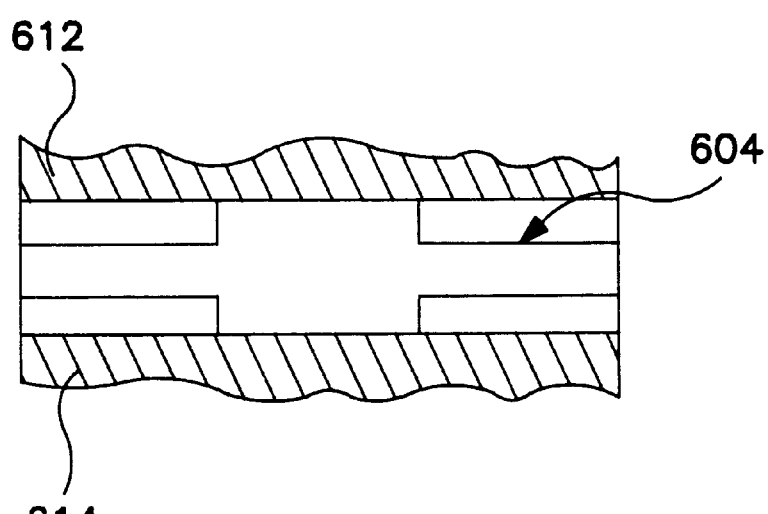
FIG. 20 is a sectional view showing the preform in a mold for pressure infiltrating molten metal into the preform of FIG. 19.
Figure 21:
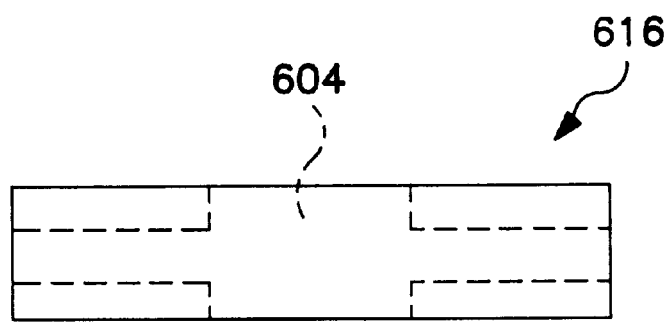
FIG. 21 is a side elevational view of the completed lid after molding.

The preform 606 is next placed in a mold and pressure infiltrated with molten aluminum. As seen in FIG. 20, the mold die 612 and 614 approximately abut the middle region of the preform, and form voids around the outer regions. After pressure infiltration, and as shown in FIG. 21, a finished lid 616 has the overall shape desired to fit the package 512, but since the middle region has a higher concentration of silicon carbine, the middle region will have a lower CTE. Specifically, the lower CTE is designed to approximately match that of the chip, which is about 2.6, while the outer regions having higher concentrations of higher CTE aluminum, approximately matches that of the constraining ring.

Because the peripheral portion of the lid that is bonded to the constraining ring should have a high aluminum and low silicon carbide concentration to approach the CTE for the ring, in absorbing the aluminum in the peripheral portion of the silicon carbide that forms the lid, relatively more aluminum is added to this peripheral portion than to the central portion of the lid. By selecting the relative concentrations in respective portions of the lid, the average CTE of the lid matches the average CTE of the package 512 and the different average CTE of the chip 518. This manipulation of relative aluminum and silicon carbide concentrations in the lid permits the microchip package and components to remain essentially flat while reducing the stress applied to the die or the adhesive interface.

The large central portion of the silicon carbide preform, which is essentially porous, establishes a ratio of aluminum to silicon carbide in the different regions of the finished lid. As noted, a greater concentration of aluminum relative to the silicon carbide is required in the vicinity of the ring. These concentrations are established by dissolving aluminum in the preform and filling the voids above and below the outer regions of the preform. In this way, a concentration of aluminum and silicon carbide producing a CTE that approaches the CTE of the ring in one region and the chip in another region is provided.

As a result, a technique now is available through the practice of the invention that enables the CTE of certain portions of the lid to be established to essentially match the CTE characteristics of other components of the chip/package system 510 (FIG. 8 that are bonded to the corresponding portions of the lid.

While silicon carbide/aluminum systems are described above, other materials may be used to form lids exhibiting different CTEs in different regions. It is also possible to use a single powdered material, ceramic or metal, and vary the CTEs in different regions by applying different consolidation forces. For example, the middle region could have a greater or lesser theoretical density than the outer regions, which could provide a sufficient difference of CTE in some cases. In this case, the powdered materials can be selected and/or mixed attain the desired differential in CTE.

Figure 22:
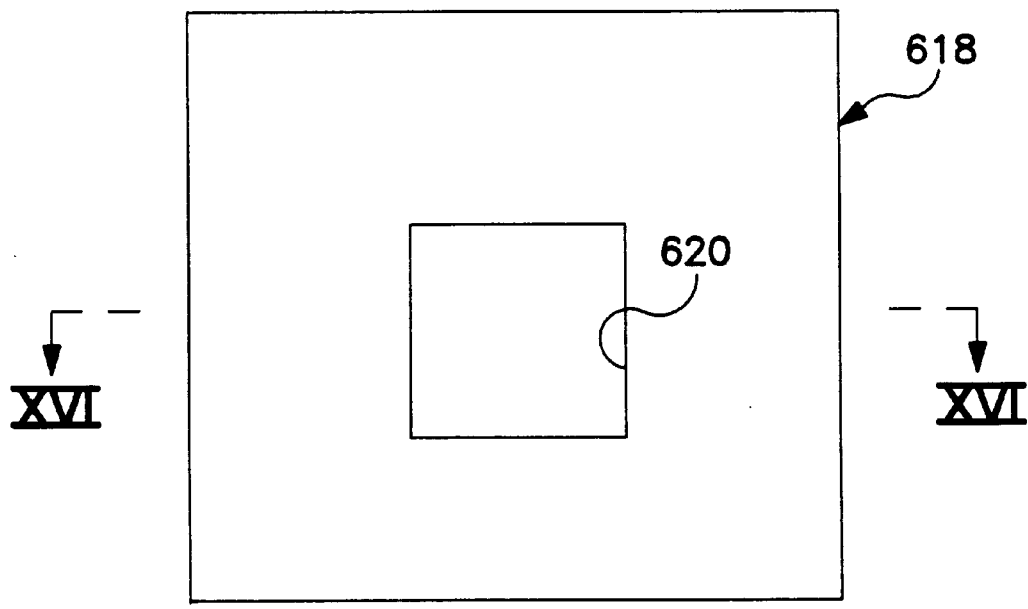
FIG. 22 is a side elevational view of a lid having an opening in the middle for receiving an insert having a different CTE than the remainder of the lid.
Figure 23:
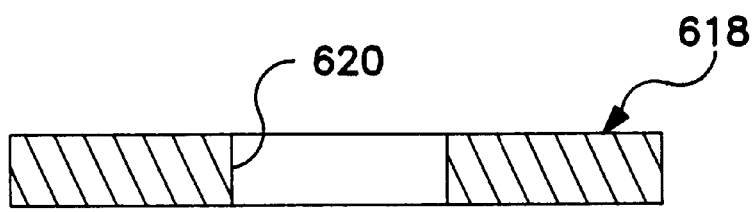
FIG. 23 is a vertical sectional view of the lid of FIG. 22, taken along line XVI—XVI of FIG. 22.
Figure 24:
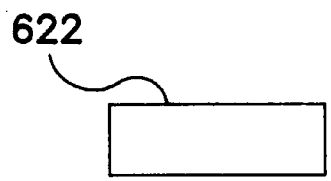
FIG. 24 is a side elevational view of an insert used to complete the lid shown in FIGS. 22 and 23.

An alternative embodiment is illustrated in FIGS. 22–24, in which a lid 618 is made to include a central opening 620. An insert 622 is sized to fit in the opening 620. The insert 622 is made of a material that has a CTE that is different than that of the material used to form the lid 618. In particular, if a lower CTE is desired for the middle region of the lid, as when the middle region overlies the chip, the insert can be made of material having a lower CTE than the rest of the lid.

To accomplish the embodiment of FIGS. 22–24, the lid 618 can be made as a single piece and the central opening 620 can be machined out, or the opening can be formed integrally, as when the lid is made from powdered metal or ceramic. The insert can be formed by the same techniques and may for example comprise a silicon carbide preform infiltrated with aluminum. At any rate, the CTE of the insert can be customized to match that of the chip while the lid 618 CTE can be customized to match that of the constraining ring.

Also, a higher concentration of silicon carbide in the center region of the lid can be accomplished by removing the center region of a low density porous silicon carbide preform which has the same dimensions of the desired lid. Into this central cavity is placed a slug of high density porous silicon carbide which fills the cavity. After impregnating this preform with aluminum, a lid with a center region of high silicon carbide concentration and a peripheral region of lower silicon carbide concentration results.

VII CTE Cancellation

Figure 25:
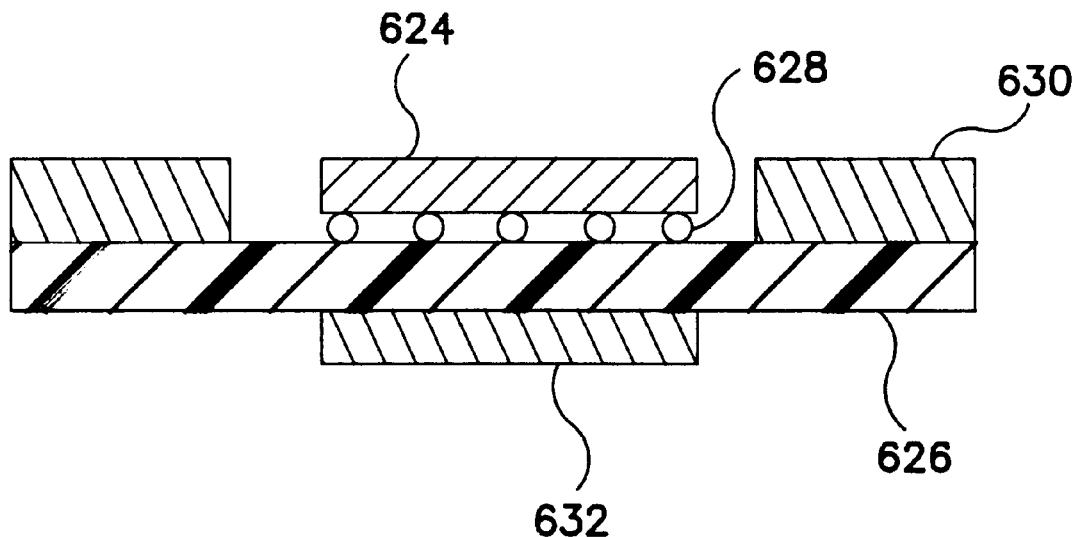
FIG. 25 is a sectional view showing a false die attached to an underside of the package opposite the chip.

Referring now to FIG. 25, a chip 624 is shown mounted on a package 626 through solder balls 628. A constraining ring 630 is mounted to the upper surface of the package 626.

Due to the difference in CTE between the chip 624 and the package 626, a bending moment is generated that acts upon the chip 624 and can potentially compromise the flatness of the chip. The differences in CTEs are largely due to the material differences in that the chip 624 is silicon and the package is one which utilizes thin organic dielectric layers made of the materials described herein.

According to the invention, a false die 632 is bonded to the lower surface of the package 626 prior to bonding the chip to the package. The false die 632 is CTE matched to the chip 624 and tends to oppose the bending moments that are generated by the chip/package attachment, particularly as the underfill adhesive is cured. Thus, the false die 632 counterbalances the moments during chip attach with opposing bending moments.

The false die 632 can be made of silicon but other materials exhibiting CTEs similar to the chip 624 can be used. However, it should be positioned directly opposite to the chip 624. Also, materials having different CTEs over the silicon chip could be used, if made thicker to resist the bending moments. For example, aluminum has a CTE of about 9, but could be used if made thick enough to get the same effect.

A further aspect of this invention is to adhesively bond the false die to the package at the same time the underfill adhesive is applied to the region between the chip 624 and the package 626. The co-curing of both adhesives will ensure that the false die bending moments offset bending moment generated by adhesive shrinkage at the underfill.

While the false die 632 can be a passive stiffener, it can also take the form of an electrical component such as a capacitor formed on the package. Also, the false die could be a real chip that failed quality control or it can be one or more circuit components that are frequently referred to as "passive" components, e.g., capacitors, resistors and inductances. The significant point being, however, that the passive component, throughout the range of anticipated operating temperatures for the microchip package, should provide thermal expansion caused bending moments that are essentially equal to, but opposite in direction to, those created by the chip.

In this manner, the forces that otherwise would warp or bend the chip and the substrate being equal but on opposite sides of the substrate mutually cancel each other. The physical consequence of the balance between these equal and opposing forces is to cancel each other, and thereby enable the chip to remain essentially flat.

Table 19 is illustrative of the experimentally developed effects of various materials, used as the electrically passive components.

TABLE 19

Effect of Different Materials
Deflection, Stresses and Critical Flaw Size
on Cooling from 150° C. to 25° C.

| Inactive Die Material | Materials Properties | Die Deflection (μm) | Package Deflection (μm) | $\sigma_1$ (Mpa) | $a_c$ (mm) |
|---|---|---|---|---|---|
| Silicon | E = 130 Gpa<br>v = 0.28<br>$\alpha$ = 2.6 × $10^{-6}$C$^{-1}$ | −1.1 | −62.6 | 11.7 | 1.141 |
| 96% Al$_2$O$_3$ | E = 320 Gpa<br>v = 0.2<br>$\alpha_1$ = 7.0 × $10^{-6}$C$^{-1}$ | −28.5 | −186.2 | 15.0 | 0.860 |
| 12/85/12 CIC | E = 140 Gpa<br>v = 0.3<br>$\alpha_1$ = 4.4 × $10^{-6}$C$^{-1}$ | −13.8 | −119.0 | 12.4 | 1.259 |
| Mo | E = 317 Gpa<br>v = 0.3<br>$\alpha_1$ = 5.0 × $10^{-6}$C$^{-1}$ | −14.0 | −119.8 | 13.3 | 1.094 |

Illustrative of the improvement afforded by different stiffener materials to maintain die area and microchip package flatness, attention is invited to Table 20:

TABLE 20

Effect of Different Die Area Stiffeners (prior to chip attach)

| Stiffener Material and Thickness | Maximum Die Non-Planarity | Maximum Package Non-Planarity |
|---|---|---|
| 381 μm Copper | −9.7 μm | −107 μm |
| 254 μm Copper | −11.4 μm | −108 μm |
| 71 μm Copper | −14.9 μm | −120 μm |
| 35 μm Copper | −16.8 μm | −132 μm |
| 381 μm Silicon | +69.7 μm | −47 μm |
| 71 μm Silicon | +64.3 μm | −80 μm |
| 381 μm Alumina | +29.9 μm | −74 μm |
| 71 μm Alumina | +50.9 μm | −91 μm |

Bonding and Assembling

Figure 7:
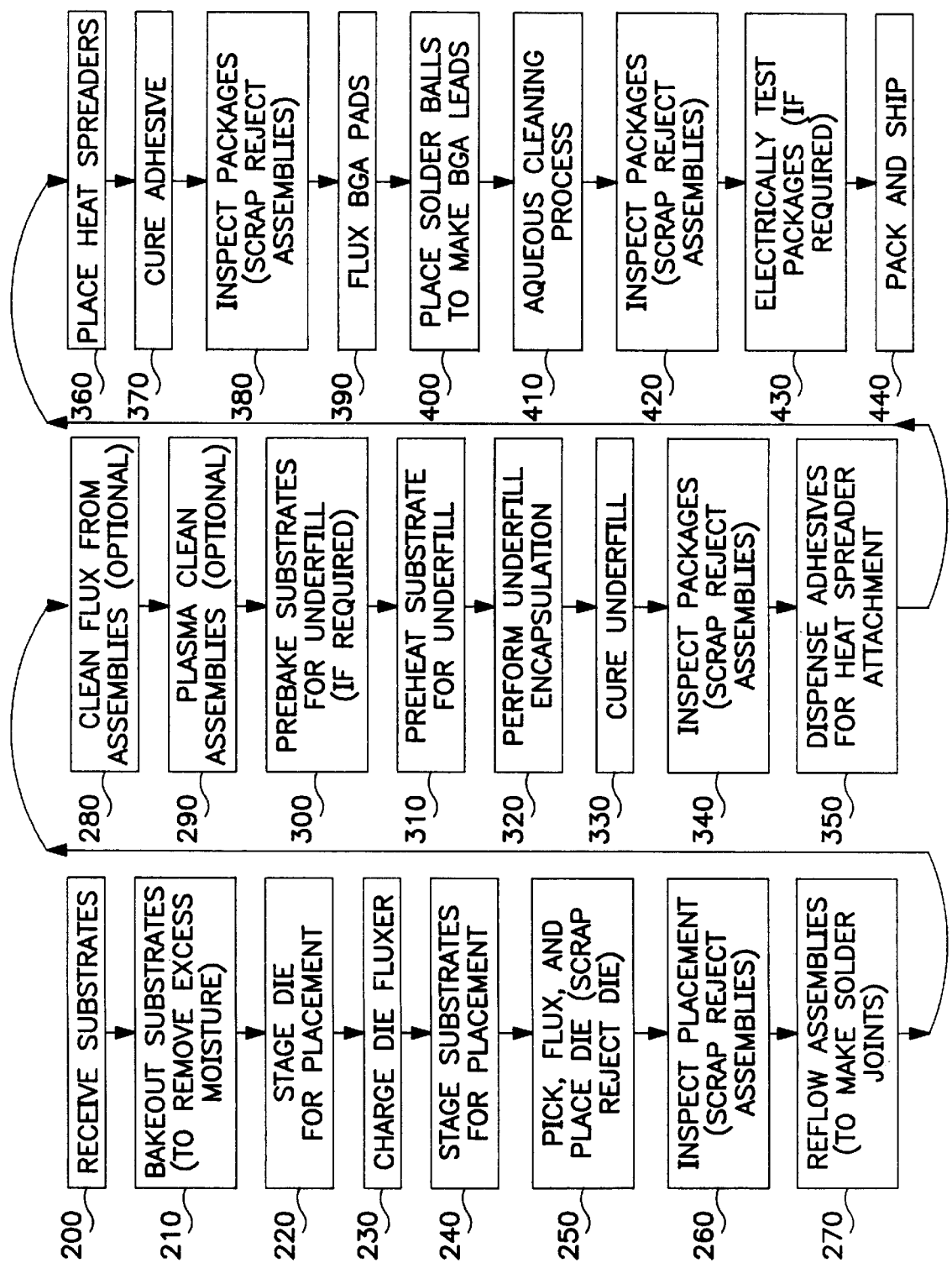
FIG. 7 is a flow diagram of the method steps in accordance with one embodiment of the present invention.

Turning now to FIG. 7, a flow diagram is illustrated which schematically details process steps for assembling an integrated circuit chip package having at least one semiconductor device bonded, connected or otherwise attached thereto in accordance with the present invention.

It should be understood that the process steps outlined in the flow diagram of FIG. 7 occur in a clean room environment having a relative humidity from about 50% to about 55%, and a temperature ranging from about 65° F. to about 72° F. It is recommended that the cleanliness of the clean room not exceed class 1,000, and preferably not exceed class 100. It has been discovered that in assembling packages made in accordance with the teachings herein, such a clean room environment reduces the chance of a particulate contamination induced defect from occurring during testing, qualifying or use of the assembled package.

At step 200, laminated substrates are provided which have been made as described in detail hereinabove. In one embodiment, the laminated substrate may be constructed to conform to present high-density chip packaging ground rules, namely 25-micron lines and spaces, 25-micron diameter blind-vias, and 50-micron buried and through vias. Such ground rules provide the capability to escape high density, area array, flip chip designs in thin, high-performance cross-sections. The laminated substrates provided at step 200 typically have a total thickness of about 500 microns, which yields significantly lower inductance than conventional substrates manufactured by techniques and materials other than those described herein. Laminated substrates made in accordance with the teachings herein have been successfully designed and fabricated to mount flip chip semiconductor devices having as many as 3800 input/output on a 240 micron pitch.

After the laminated substrates have been manufactured, the substrates are packaged in a sealed polymeric bag having a desiccant material disposed therein. At this time, the laminated substrates are in an unknown moisture state. Accordingly, the laminated substrates are removed from the polymeric bag and baked at step 210. This baking process "bakes out" excess moisture which may be present within the laminated substrates.

The bake out, or baking, procedure at step 210 preferably occurs at a temperature of 125° C. for about 24 hours. The bake out procedure may occur at higher temperatures than 125° C. in combination with a shorter time period than 24 hours, however, the bake out temperature should not exceed 165° C. The bake out is performed in a convection oven having an adequate exhaust system to permit moisture to be removed from the bake out environment. The substrates are baked in JEDEC type shipping trays comprised of a semi-conducting material. These trays isolate the substrates in pockets which permit the substrates to be exposed to a free flow of the heated air of the convection oven. Before further processing of the laminated substrates occurs, the substrates are cooled to ambient temperature. If further processing is expected to occur at a time greater than 4 hours after the substrates have been cooled to ambient temperature, the substrates are stored in a nitrogen dry box. The nitrogen dry box prevents corrosion of metallic surfaces of the laminated substrate and prevents the laminated substrate from absorbing moisture.

After the laminated substrates have been adequately baked out to remove excess moisture and cooled to ambient temperature, semiconductor devices, die or chips to be packaged are staged for further processing at step 220. Typically, the die are placed in suitable containers, such as FLUOROWARE brand containers, whereby they are staged ready for further assembly and processing.

At step 230, a thin film type die fluxer is suitably charged for fluxing operations. The die fluxer comprises a flat, rotating platen that is doctor bladed to an optimized thickness. It has been discovered that in order for fully assembled integrated circuit chip packages (i.e., fully assembled packages having at least one semiconductor device bonded, attached or mounted thereon) to survive industry testing and qualification procedures, an optimized flux thickness of 1.5 mils±0.5 mils is utilized. Such an optimized flux thickness equates to a thickness of less than about 50% the height of the solder bumps of a semiconductor die to be packaged. A suitable flux which is particularly useful in the method of the present invention is HERAEUS brand SF37 no clean flip chip type flux.

As should be understood, it has been discovered that excess flux residue on the semiconductor die causes a particular failure mechanism to occur in testing and qualification of packages made and assembled in accordance with the teachings herein. More particularly, it has been discovered that excess flux residue causes delamination to occur in fully assembled packages at a juncture between the fully cured underfill and a bottom surface of a packaged die. Experimentation has demonstrated that excess flux residue present on surfaces of the semiconductor die inhibits adhesion between the cured underfill and the bottom surface of the die. In general, low activity, low residue, no clean type fluxes are suitable for use in the methods and processes disclosed herein.

The term "low activity" is intended to mean a type of flux that does not contain a substantial volume of high activity chemical wetting agents disposed therein. The term "low residue" is intended to mean a type of flux that does not deposit a substantial amount of residue on any presented surfaces after the laminated substrate assembly passes through the reflow oven in down stream process steps.

The assembled laminated substrates are staged for placement for further processing at step 240. The assembled laminated substrates are transferred to a nickel plated aluminum alloy work holder tray where the laminated substrates are readied to receive semiconductor die.

At step 250, an automatic pick and place machine picks an individual staged die at step 220 and transfers the die over a precision lighting system having a high accuracy camera. The camera identifies and verifies all solder bumps of the individual die. If any solder bumps are missing or physically damaged the die is removed from further processing. Once the high accuracy camera has identified and verified all the solder bumps of the individual die, the camera locates the center of the die for exact placement on an individual laminated substrate. Once the center of the die has been identified, the picked die is transferred to the thin film type die fluxer. At the thin film type die fluxer, the solder bumps of the semiconductor die are dipped into the optimized charged volume of the flux, described hereinabove. Once fluxed, the die is lifted from the volume of flux and is accurately placed on a staged laminated substrate. At this time, the accurately placed die on the staged laminated substrate are now metallurgically or solderably bonded to the substrate.

At step 260, the placed die on the staged laminated substrate are inspected to insure that the solder bumps of the semiconductor die have been accurately placed on the flip chip pads of the laminated substrate. After all of the individual laminated substrates of an individual nickel plated aluminum alloy work holder tray have received at least one semiconductor die, the work holder tray is transferred to a reflow oven at step 270.

It should be understood that the reflow profile at step 270 has been optimized in accordance with the teachings of the present invention to match flip chip solder bump metallurgy, flux chemistry and to maintain reflow temperature below 260° C.

At least three flip chip solder bump metallurgies have been discovered to be effective for use with the method of the present invention, namely a eutectic (63/37) tin/lead solder, having a melt temperature of about 183° C.; and two higher-melting bump compositions, having melt temperatures in a range from about 250° C. to about 375° C. In the case of the eutectic (63/37) tin/lead solder, the reflow temperature profile is maintained between 183° C. and 225° C. Referring to the two higher-melting bump compositions, these bump compositions are not designed to be conventionally reflowed. With these bump compositions, a unique solder reflow profile is employed to ensure suitable metallurgical bonding between the bumps and the solder pads of the laminated substrate and to ensure that the laminated substrate is not damaged by the reflow process. In this regard, it should be noted that damage may occur to the laminated substrate at temperatures above 260° C. In the case of higher-melting bump compositions, i.e., above 260° C., such high-melt bumps are connected to the flip chip pads of the laminated substrate with eutectic solder.

The reflow profile must also be optimized and tailored to match particular flux chemistries. More particularly, different flux chemistries are activated in different ways. Some flux chemistries are made to be reflowed with a steep rise to the reflow temperature and a steep drop to ambient. However, a preferred flux, HERAEUS brand SF37 is activated at a temperature of about 160° C. and is plateaued at this temperature for about two minutes and is then spiked up to the melting range or reflow of the employed solder. For eutectic solder bumps, solder reflow has been optimized at 220° C.±5° C.

As described hereinabove, in accordance with the present invention, solder reflow temperatures must be maintained below 260° C. At temperatures above 260° C., components within the laminated substrate described herein will begin to breakdown. For example, it has been discovered that the employed solder mask begins to char at temperatures above about 255° C. It has been predicted by experiment and analysis that failures of the laminated substrate will occur due to material property breakdowns of the laminated substrate if the solder mask is permitted to char.

The laminated substrates having at least one attached semiconductor die are next cleaned at either step 280 or step 290 depending on the type flux employed.

At step 280, the assemblies are cleaned by a liquid method using a suitable solvent, such as but not limited to de-ionized water, terpene or xylene. A preferred cleaning method for cleaning flux residue from under a flip chip die at step 280 includes placing the assembly into a centrifugal cleaning assembly and spraying the spinning assembly with the suitable solvent. The spinning assembly is then rinsed with a de-ionized water.

If a low activity, low residue, no clean type flux is employed, the assembly is not liquid cleaned as in step 280, but instead plasma cleaned in step 290. The plasma cleaning of step 290 requires that the assemblies of step 270 be placed in a chamber of a plasma cleaning apparatus in an electrically charged tray adjacent to, or above, an oppositely electrically charged tray. A vacuum is drawn in the chamber. An atmosphere that is conductive to generating a plasma is introduced into the chamber. Suitable voltage and current are then applied to induce a plasma cleaning action within the chamber. The plasma cleaning action impinges on all surfaces of the assembly thereby removing extraneous residue and particulate contaminates from the assembly.

If a moisture sensitive underfill is employed, the assembly is prebaked at step 300 to remove all moisture which may have been adsorbed by upstream process steps 220 through 290. An optimal pre-bake occurs in a convection oven at a temperature of 165° C. for no less than about 15 minutes and no more than about 30 minutes. The assembly is then allowed to cool down to the preheat temperature of step 310.

At step 310, the assembly of steps 200 through 300 is preheated in preparation for underfill. The preheated temperature is 85° C.±5° C. as measured directly on the assembly. To prepare for this preheating, the assemblies are loaded in the nickel plated aluminum alloy work holder trays described hereinabove. The work holder trays are next placed upon a preheating platen within an underfill liquid dispense system. Preheating is accomplished during a time period of from about 3 to about 5 minutes to reach the required temperature of 85° C.±5° C. Once preheated, underfill encapsulation occurs at step 320.

Figure 27:
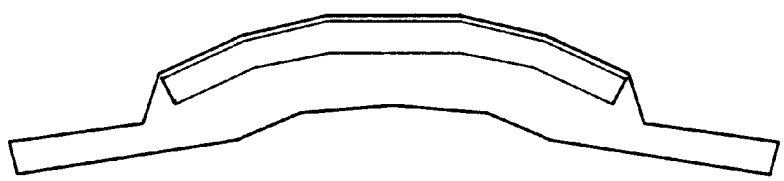
FIG. 27 is an exaggerated schematic of an improperly assembled flip chip package in a first mechanical stress orientation.
Figure 28:
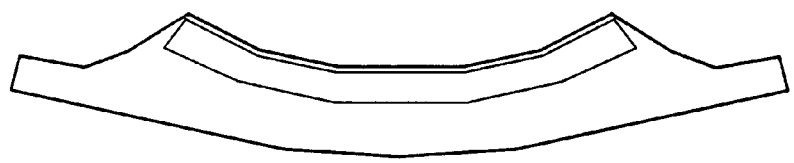
FIG. 28 is an exaggerated schematic of an improperly assembled flip chip package in a second mechanical stress orientation.

In the flip chip package of the present invention, the silicon die has a coefficient of thermal expansion (CTE) of about 3 ppm/° C. The laminated substrate has a CTE of about 12 to 18 ppm/° C. An underfill material is employed in accordance with the teachings herein to prevent premature solder bump fatigue failure due to the CTE mismatch between the silicon die and the laminated organic substrate. However, as may be appreciated, when the underfill is cured, it bonds two greatly dissimilar components. The flip chip package assembly has an essentially zero-stress state at the underfill material's gel temperature. When the flip chip package cools below the gel temperature of the underfill, it warps concave down as schematically exaggerated in FIG. 27. When the flip chip package is heated above the gel temperature, the package warp is concave-up as schematically exaggerated in FIG. 28.

More particularly, die cracking may occur at ambient and lower temperatures; and underfill-die delamination may occur at higher temperatures, such as during solder reflow, JEDEC moisture testing, BGA ball attach, or board level assembly operations.

In accordance with the teachings of one embodiment of the present invention, a group of underfill materials have been identified which eliminate the aforedescribed failure mechanisms for flip chip packages made in accordance with the teachings of the present invention. Underfill materials in this group have the properties outlined in Table 21.

TABLE 21

| Elastic modulus (E): | Less than about 10 Gpa |
|---|---|
| Poisson's Ratio (v): | Less than about 0.2900 |
| Coefficient of Thermal Expansion: | Less than about 32 ppm/° C. |
| Linear Cure Shrinkage: | Less than about 0.2% |

Also, it has been discovered that underfill materials with finer (<25 μm) spherical fillers exhibit reduced filler segregation and sedimentation which results in better uniformity in the underfill cross-section and exceptional reliability performance. The better uniformity achieved by such underfill materials substantially reduces, if not eliminates, underfill-die delamination at the higher temperatures described hereinabove.

It has been further discovered that optimizing the CTE of the cured underfill preferably to less than about 32 ppm/° C., more preferably to less than about 30 ppm/° C., and most preferably to less than about 28 ppm/° C., substantially reduces, if not eliminates, the aforedescribed two failure mechanisms.

Referring back to FIG. 7, underfill encapsulation occurs at step 320. In this regard, a syringe of underfill material described hereinabove, such as a syringe having a volume of 10 cc, for example, is removed from its freezer storage at −40° C. and allowed to come to ambient temperature in preparation for the underfill dispense operation. An automated underfill dispense system is employed which accurately controls the volume amount of underfill material which is delivered under each die flip chip package assembly. Preferably, a 20 to 22 gauge dispense needle is positioned such that it operates about 10 mils above a surface of the substrate and about 10 to about 25 mils from an edge surface of a respective die. The automated underfill dispense system then proceeds to lay down a bead of underfill material along the edge surface of the die. The underfill material is pulled under the die by capillary action.

It has been discovered that for die up to about 15 mm×15 mm square, a preferred underfill dispense routine comprises laying down underfill material in three single passes along one side of the die and a final U-shaped single pass is then accomplished on the other three sides. For die larger than 15 mm×15 mm square, a preferred underfill dispense routine comprises two single passes along one side of the die, two additional passes along one other side of the die and a final single U-shaped seal pass about the die. One key aspect during the actual underfill process is the delay time between individual passes of the underfill material. A sufficient amount of time must be allowed to permit the capillary action to sufficiently draw the underfill material under the die. For first passes on each individual die of any size, a preferred time delay between the first and second pass is about 45 seconds. Between all additional individual subsequent passes, a 90 second delay is utilized.

After the liquid underfill dispense operation, the packaged die filled work holder is removed from the heated platter of the automated underfill dispense system and is expeditiously (i.e., within 30 minutes) placed into an underfill curing oven at step 330.

For flip chip packages made in accordance with the teachings herein, total die stress of the packaged flip chip die must be minimized. It has been discovered that a low temperature cure is necessary to minimize total die stress in a packaged die thereby minimizing total die warp of the packaged die. To accomplish the foregoing, it is necessary to gel the underfill material at the lowest possible temperature. As the term is used herein, "gel" is intended to mean the point at which the liquid underfill becomes a solid, i.e., the point at which the underfill material develops a measurable elastic modulus. Once the underfill material begins to gel, bonding occurs between the die and the laminated substrate, and die stress may being to occur. However, it must be remembered that manufacturing requirements and changes in final cured underfill properties may necessitate the use of higher cure temperatures due to such consideration as moisture absorption and glass transition temperatures, for example. Cure schedules, specific underfill properties of preferred underfill materials and preferred process parameters are provided in Tables 22 and 23.

TABLE 22

|  | Type 1 | Type 2 | Type 3 |
|---|---|---|---|
| Viscosity, Pa · s | 4.9 (at 25° C.) | 40 | 18 |
| Filler Size, micron | <25 | <25 | <25 |
| Filler wt % | 63.5 | 55 | 60 |
| Na, Cl, K, F (mil. Std 883D, 50113 | <10 ppm | — | — |
| Tg, TMA | 150° C. | 137° C. | 135° C. |
| Tg, DMA | — | 160° C. | 162° C. |
| CTE, TMA ppm/° C. | <30 | 32 | 26 |
| Elastic Modulus, DMA | ≈10 GPa | 9 GPa | 9 GPa |

TABLE 23

|  | Type 1 | Type 2 and 3 |
|---|---|---|
| Substrate Prebake | 125° C., 24 hours | 125° C., 24 hours |
| Flux Thickness | 1.5 +/− 0.5 mil (38 +/− 12 pm) | 1.5 +/− 0.5 mil (38 +/− 12 pm) |
| Time To Reflow After Fluxing | <2 hours | <2 hours |
| Reflow Parameters | 220° C. +/− 5° C. | 220° C. +/− 5° C. |
| Reflow Atmosphere | nitrogen, <150 ppm oxygen | nitrogen, <150 ppm oxygen |
| Flux Cleaning | not required | not required |
| Plasma Cleaning | optional | optional |
| Time To Underfill After Reflow | <4 hours | not required |
| Substrate Prebake Before Underfill | 165° C., 15 minutes | 165° C., 15 minutes |
| Substrate Heating During Underfill | 85° C. +/− 5° C. | 85° C. +/− 5° C. |
| Dispenser Needle | 22 gauge | 22 gauge |
| Dispenser Needle Heat | not required | not required |
| Needle Height Above Substrate | 10 mils (254 μm) | 10 mils (254 μm) |
| Distance Die Edge To Needle CL | 23 mils (584 μm) | 23 mils (584 μm) |
| Underfill Flow Rate | 3–6 mg/sec | 3–6 mg/sec |
| Underfill Flow Pattern | die specific | die specific |
| Underfill Material Mass | die specific | die specific |
| Underfill Cure Schedule | 120° C., 30 minutes 150° C., 30 minutes 165° C., 60 minutes | 160° C., 30 minutes |

By using the foregoing cure schedules in combination with a respective underfill material, it has been discovered that the respective underfill material may be gelled at the lowest possible temperature, while still fully curing the underfill material. Therefore, such cure schedules reduce total die stress, which minimizes the risk of die cracking, while simultaneously fully curing the underfill material, which reduces moisture absorption and die/underfill delamination. At the end of the underfill cure schedule the packaged die filled work holder is removed from the underfill curing oven and is allowed to cool down to ambient temperature. The flip chip package assemblies are next inspected at step 340.

At step 340, the flip chip packages of steps 200 through 330 are inspected by one or more of the following techniques: visually, C-mode scanning acoustic microscopy (CSAM); or x-ray inspection. Inspection is directed to ensure that the underfill material has fully cured, the underfill material has filled the die area adequately without leaving large voids and that no die cracking has occurred. Flip chip packages which have failed the inspection at step 340 are appropriately scrapped. Flip chip packages which pass are further processed at step 350.

If the flip chip package of the present invention is to be equipped with a head spreader to permit the attachment of a heat sink thereto, a heat spreader adhesive is dispensed at step 350. However, it has been discovered that conventional heat spreader adhesives, such as a high modulus, silver filled epoxy adhesives, when used between the die and the heat spreader, unduly stress the flip chip package of the present invention thereby causing die fracture or delamination of the heat spreader from the die area. To best understand process step 350 of the present invention, reference to FIG. 26 is appropriate.

Figure 26:
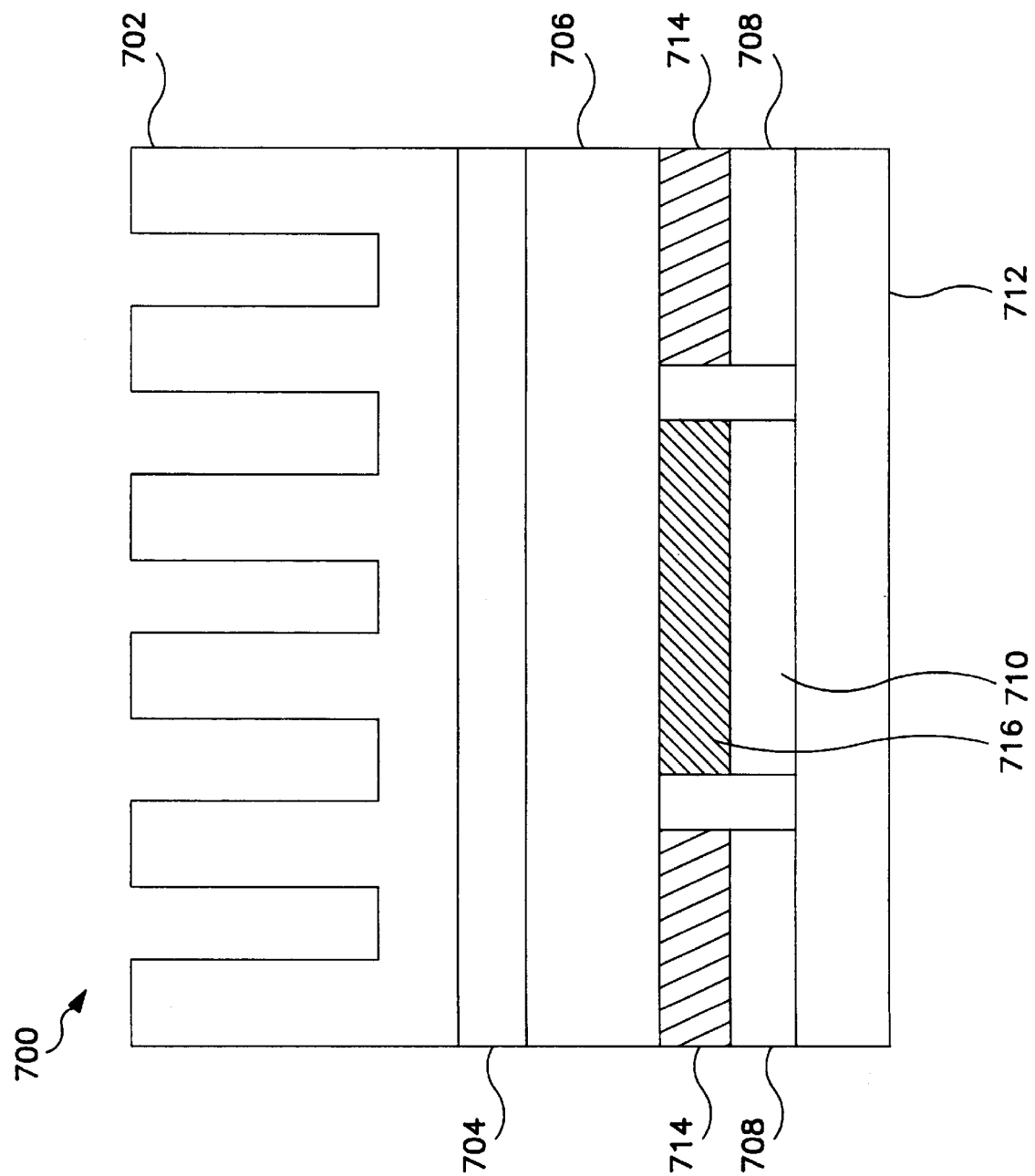
FIG. 26 is a schematic illustration of a flip chip package assembly made in accordance with teachings for the present invention.

As best illustrated by FIG. 26, a flip chip package assembly of the present invention is schematically illustrated generally at 700. The flip chip package 700 includes a heat sink 702, a thermally conductive interface material 704, a heat spreader 706, a stiffener ring 708, a semiconductor die 710 and a laminated substrate 712. In accordance with the teachings of the present invention, a high modulus, silver filled epoxy adhesive is only used at areas 714 between the heat spreader 706 and the stiffener ring 708. However, a substantially more flexible material, such as a filled elastomer material for example, must be used at location 716, between the heat spreader 706 and the die 710.

As should be understood, the stiffener ring 708 and the heat spreader 706 are both comprised of a nickel gold plated copper substrate. Therefore, there is no mismatch of CTE between these components; and any suitable robust adhesive material may be employed at the juncture of the ring 708 and the heat spreader 706, such as a silver filled epoxy (GRACE C990). However, there is a mismatch of CTE between the heat spreader 706 and the die 710. More particularly, the CTE of the heat spreader 706 is about 16 ppm/° C. and the CTE of the die 710 is about 3 ppm/° C. Therefore, it has been discovered that at location 716 between the heat spreader 706 and the die 710, a flexible adhesive material is required. A filled elastomer adhesive material, such as a filled silicone adhesive material (GE 3281 brand filled silicone material from the General Electric Company) is suitable for use at location 716. Once the adhesive for the heat spreader has been dispensed at step 350, as described hereinabove, the heat spreader is placed in proper position at step 360 by appropriate pick and place type automated equipment.

At process step 370, both the heat spreader adhesive materials which have been dispensed at locations 714 and 716 are cured using a cure schedule comprising a temperature of 150° C. for 60 minutes. The flip chip packages of steps 200 through 370 are inspected, as described hereinabove, at step 380.

Once the heat spreader 706 has been completely incorporated into the flip chip package 700, BGA pads of the flip chip package are fluxed at step 390 in preparation for the incorporation of solder balls at step 400. A water soluble flux is employed at step 390 to avoid the occurrence of flux residue during the final steps of the process of the present invention. Suitable water soluble fluxes include, but are not limited to such preferred fluxes as, ALPHA 609 and INDIUM TAC FLUX 4 type fluxes.

At step 400, individual solder spheres or balls are located on individual fluxed BGA pads. In one embodiment, 25 mil diameter 63/37 eutectic tin/lead solder balls are employed, which are manufactured by either the Alpha Corporation or the Indium Corporation. The individual solder balls or spheres are suitably located by automatic pick and place type equipment. Once the solder spheres are located on the fluxed BGA pads, the assemblies are transferred to a solder reflow oven, wherein the solder balls are reflowed thereby becoming integrated with the flip chip package. Once removed from the reflow oven, the packages are cleaned at step 410 with a suitable aqueous cleaner to remove any solder flux residue. The completed packages are next inspected at step 420, as described hereinabove. The completed packages may be suitably electrically tested at step 430, if desired. Completed packages which pass the inspection steps 420 and 430 are packed and shipped at step 440.

It should be understood that FIG. 7 is not intended to limit the scope of the present invention, but is merely illustrative of one embodiment of the present invention. For example, in an alternate embodiment of the present invention, process steps 390, 400, 410 and 420 may be interchanged in the order of the process flow diagram of FIG. 7 in the place of process steps 350, 360, 370 and 380.

While the present invention has been described in connection with the illustrated embodiments, it will be appreciated and understood that modifications may be made without departing from the true spirit and scope of the invention.

We claim:

1. A method for assembling an integrated circuit chip package having an organic package substrate and an integrated circuit chip, said method comprising the following steps:

providing an organic package substrate having,
- A) a metal core having at least one clearance formed therethrough,
- B) at least one dielectric layer disposed on each of top and bottom surfaces of said metal core, said at least one dielectric layer being a polytetrafluoroethylene material having a mixture disposed within said material, said mixture containing particulate filler,
- C) at least one conductive layer disposed on each of said dielectric layers and at least one conductive via electrically connecting said conductive layers, and
- D) a plurality of interconnect pads adapted to electrically and mechanically mount an integrated circuit chip;

providing an integrated circuit chip having disposed on a surface thereof a plurality of solder interconnect members;

locating the integrated circuit chip on said organic package substrate in an orientation wherein each of said solder interconnect members of said integrated circuit chip are aligned with an individual interconnect pad of said organic package substrate;

heating the organic package substrate and the integrated circuit chip to a temperature of less than 260° C. to thereby mechanically and electrically attach the integrated circuit chip to the organic package substrate;

cleaning said integrated circuit chip and said organic package substrate with a solvent liquid;

plasma cleaning said integrated circuit chip and said organic package substrate;

heating said integrated circuit chip and said organic package substrate to a temperature ranging from about 70° C. to about 90° C.;

providing an underfill bonding material having an elastic modulus less than about 10 Gpa, a Poisson's Ratio less than about 0.29, a coefficient of thermal expansion of less than about 32 ppm/°C., and a linear cure shrinkage of less than about 0.2%;

disposing said underfill bonding material between said integrated circuit chip and said organic package substrate; and curing said underfill bonding material.

2. A method for assembling an integrated circuit chip package having an organic package substrate and an integrated circuit chip, said method comprising the following steps:

providing an organic package substrate having,
- A) a metal core having at least one clearance formed therethrough,
- B) at least one dielectric layer disposed on each of top and bottom surfaces of said metal core, said at least one dielectric layer being a fluoropolymer material having a mixture disposed within said material, said mixture containing particulate filler,
- C) at least one conductive layer disposed on each of said dielectric layers and at least one conductive via electrically connecting said conductive layers, and
- D) a plurality of interconnect pads adapted to electrically and mechanically mount an integrated circuit chip;

providing an integrated circuit chip having disposed on a surface thereof a plurality of solder interconnect members;

locating the integrated circuit chip on said organic package substrate in an orientation wherein each of said solder interconnect members of said integrated circuit chip are aligned with an individual interconnect pad of said organic package substrate;

heating the organic package substrate and the integrated circuit chip to a temperature of less than 260° C. to thereby mechanically and electrically attach the integrated circuit chip to the organic package substrate;

cleaning said integrated circuit chip and said organic package substrate with a solvent liquid;

plasma cleaning said integrated circuit chip and said organic package substrate;

heating said integrated circuit chip and said organic package substrate to a temperature ranging from about 70° C. to about 90° C.;

providing an underfill bonding material having an elastic modulus less than about 10 Gpa, a Poisson's Ratio less than about 0.29, a coefficient of thermal expansion of less than about 32 ppm/°C., and a linear cure shrinkage of less than about 0.2%;

disposing said underfill bonding material between said integrated circuit chip and said organic package substrate; and curing said underfill bonding material.

* * * * *